(12) United States Patent
Hiwatari et al.

(10) Patent No.: US 8,470,937 B2
(45) Date of Patent: Jun. 25, 2013

(54) CURABLE COMPOSITION FOR SEMICONDUCTOR ENCAPSULATION

(75) Inventors: Ken-ichiro Hiwatari, Tokyo (JP); Isamu Yumoto, Tokyo (JP)

(73) Assignee: Adeka Corporation, Tokyo (JP)

( * ) Notice: Subject to any disclaimer, the term of this patent is extended or adjusted under 35 U.S.C. 154(b) by 0 days.

(21) Appl. No.: 13/382,571

(22) PCT Filed: May 26, 2011

(86) PCT No.: PCT/JP2011/062066
§ 371 (c)(1),
(2), (4) Date: Jan. 6, 2011

(87) PCT Pub. No.: WO2012/014560
PCT Pub. Date: Feb. 2, 2012

(65) Prior Publication Data
US 2012/0126435 A1    May 24, 2012

(30) Foreign Application Priority Data

Jul. 27, 2010 (JP) ................................. 2010-167810

(51) Int. Cl.
*C08L 83/14* (2006.01)
(52) U.S. Cl.
USPC ............... 525/478; 525/477; 528/15; 528/31; 528/32; 528/35; 528/43; 428/447
(58) Field of Classification Search
None
See application file for complete search history.

(56) References Cited

U.S. PATENT DOCUMENTS

| 4,760,122 A * | 7/1988 | Nakos et al. ................. 526/242 |
| 5,344,593 A | 9/1994 | Chiba et al. |
| 6,331,578 B1 * | 12/2001 | Turner et al. ................. 523/105 |
| 7,527,871 B2 * | 5/2009 | Morita et al. ................. 428/447 |
| 2007/0106016 A1 | 5/2007 | Zhu |
| 2007/0197755 A1 | 8/2007 | Sueyoshi et al. |
| 2009/0082517 A1 | 3/2009 | Tanaka et al. |
| 2010/0179283 A1 | 7/2010 | Sueyoshi et al. |

FOREIGN PATENT DOCUMENTS

| JP | 5-156166 | 6/1993 |
| JP | 11-269387 | 10/1999 |
| JP | 2004-231824 | 8/2004 |
| JP | 2005-325174 | 11/2005 |
| JP | 2005-350582 | 12/2005 |
| JP | 2006-206721 | 8/2006 |
| JP | 2008-143980 | 6/2008 |
| JP | 2008-251932 | 10/2008 |
| JP | 2009-515028 | 4/2009 |
| JP | 2011-063688 | 3/2011 |
| WO | 2008-133229 | 11/2008 |

OTHER PUBLICATIONS

International Search Report, PCT/JP2011/062066 dated Sep. 13, 2011.

* cited by examiner

*Primary Examiner* — Marc Zimmer
(74) *Attorney, Agent, or Firm* — Young & Thompson

(57) ABSTRACT

Provided are a curable composition for semiconductor encapsulation which produces a cured product that is excellent in heat resistance, electrical insulation properties at high temperatures, flexibility and heat cycle resistance, and a semiconductor device encapsulated by curing this curable composition. Specifically, there is provided a curable composition for semiconductor encapsulation containing, as component (A), a particular SiH group-containing siloxane compound; as component (B), a particular vinyl group-containing siloxane compound; as component (C), a compound having at least three SiH groups or at least three vinyl groups; and as component (D), a hydrosilylation catalyst.

14 Claims, No Drawings

CURABLE COMPOSITION FOR SEMICONDUCTOR ENCAPSULATION

TECHNICAL FIELD

The present invention relates to a curable composition for semiconductor encapsulation, which produces a cured product that is excellent in heat resistance, electrical insulation properties at high temperatures, flexibility and heat cycle resistance, and a semiconductor device encapsulated by curing this curable composition.

BACKGROUND ART

SiC (silicon carbide) is such that since the material has a smaller energy loss at the time of electric current application than silicon, the calorific value is small, and since the heat resistance is high, the material is capable of handling larger electric power. Thus, investigations are being actively conducted on the use of SiC power semiconductors as next-generation power semiconductors that would replace silicon power semiconductor, which is extensively used. While the heat resistance limit temperature of silicon power semiconductor devices is about 150° C., an investigation is being conducted on raising the heat resistance limit temperature of SiC power semiconductor devices to 200° C. to 300° C.

As a class of encapsulating material/insulating material for silicon power semiconductor devices, organopolysiloxane resins (also referred to as silicone resins) have been used (see, for example, Patent Literatures 1 to 5). Organopolysiloxane resins are excellent in heat resistance, electrical insulation properties, weather resistance and the like; however, those conventionally known organopolysiloxane resins cannot be said to have sufficient heat resistance or electrical insulation properties at high temperatures, and the resins have a problem that the electrical insulation properties deteriorate when the resins are put to use for a long time period at a temperature exceeding 200° C. The organopolysiloxane resins have been unsatisfactory as a class of encapsulating material/insulating material for silicon power semiconductor. Particularly, the encapsulating materials/insulating materials for SiC power semiconductors that are used in railway vehicles, hybrid cars, electric cars, electromagnetic cookers and the like, are required to exhibit high electrical insulation properties and sufficient sealability, when used at high temperatures as well as when used repeatedly over a range from a low temperature to a high temperature. However, such an encapsulating material/insulating material has not yet been obtained to date.

PRIOR ART DOCUMENTS

Patent Documents

Patent Literature 1: Japanese Patent Application Laid-Open (JP-A) No. 2005-350582

Patent Literature 2: JP-A No. 2006-206721

Patent Literature 3: JP-A No. 2008-143980

Patent Literature 4: US Patent Application No. 2009-0082517 A1

Patent Literature 5: JP-A No. 2008-251932

DISCLOSURE OF THE INVENTION

Problem to be Solved by the Invention

An object of the present invention is to provide a curable composition for semiconductor encapsulation which produces a cured product that is excellent in heat resistance, electrical insulation properties at high temperatures, flexibility and heat cycle resistance, and to provide a semiconductor device encapsulated by curing this curable composition.

Means for Solving the Problem

The inventors of the present invention conducted a thorough investigation, and as a result, they found that a curable composition containing a silicon-containing compound having a particular structure can achieve the object described above, thus completing the present invention.

That is, the present invention is to provide a curable composition for semiconductor encapsulation, containing: as component (A), a SiH group-containing siloxane compound represented by the following formula (1); as component (B), a vinyl group-containing siloxane compound represented by the following formula (2); as component (C), a compound having at least three SiH groups or at least three vinyl groups; and as component (D), a hydrosilylation catalyst.

[Chemical Formula 1]

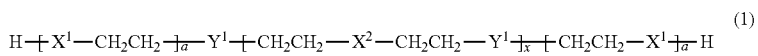

(1)

wherein $X^1$ represents a residue obtainable by excluding hydrogen atoms from the SiH groups of a compound having two SiH groups and having a molecular weight of 1000 or less; $X^2$ represents a residue obtainable by excluding hydrogen atoms from the SiH groups of a compound having two SiH groups and having a molecular weight of 1000 or less, or a residue obtainable by excluding vinyl groups from a compound having two vinyl groups and having a molecular weight of 1000 or less; $Y^1$ represents a polysiloxane group represented by the following formula (3); a represents a number of 0 or 1; and x represents a number from 0 to 10, provided that the compound represented by the formula (1) is such that the mass average molecular weight is 3000 to 1,000,000; the proportion of the number of aryl groups each having 6 to 10 carbon atoms and bonded to silicon atoms, with respect to the sum of the number of alkyl groups each having 1 to 4 carbon atoms and bonded to silicon atoms and the number of aryl groups each having 6 to 10 carbon atoms and bonded to silicon atoms, is 0.05 to 0.5; and the content of $Y^1$—$CH^2CH^2$ groups is 0.2 mmol/g or less;

[Chemical Formula 2]

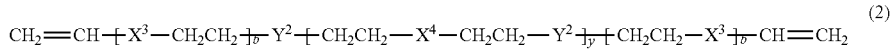

(2)

wherein $X^3$ represents a residue obtainable by excluding vinyl groups from a compound having two vinyl groups and having a molecular weight of 1000 or less; $X^4$ represents a residue obtainable by excluding vinyl groups from a compound having two vinyl groups and having a molecular weight of 1000 or less, or a residue obtainable by excluding hydrogen atoms from the SiH groups of a compound having two SiH groups and having a molecular weight of 1000 or less; $Y^2$ represents a polysiloxane group represented by the following formula (4); b represents a number of 0 or 1; and y represents a number from 0 to 10, provided that the compound represented by the formula (2) is such that the mass average molecular weight is 3000 to 1,000,000; the proportion of the number of aryl groups each having 6 to 10 carbon atoms and bonded to silicon atoms, with respect to the sum of the number of alkyl groups each having 1 to 4 carbon atoms and bonded to silicon atoms and the number of aryl groups each having 6 to 10 carbon atoms and bonded to silicon atoms, is 0.05 to 0.5; and the sum of the contents of $Y^2$—$CH^2CH^2$ groups and vinyl groups is 0.002 to 0.7 mmol/g or less;

[Chemical Formula 3]

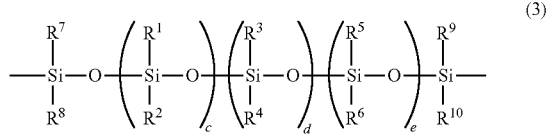

(3)

wherein $R^1$ to $R^3$ each independently represent an alkyl group having 1 to 4 carbon atoms; $R^4$ to $R^6$ each independently represent an aryl group having 6 to 10 carbon atoms; $R^7$ to $R^{10}$ each independently represent an alkyl group having 1 to 4 carbon atoms, or an aryl group having 6 to 10 carbon atoms; c, d and e represent numbers that make up the mass average molecular weight of the compound represented by the formula (1) to 3000 to 1,000,000; and

[Chemical Formula 4]

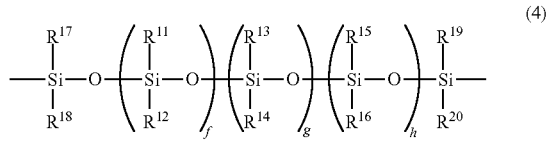

(4)

wherein $R^{11}$ to $R^{13}$ each independently represent an alkyl group having 1 to 4 carbon atoms; $R^{14}$ to $R^{16}$ each independently represent an aryl group having 6 to 10 carbon atoms; $R^{17}$ to $R^{20}$ each independently represent an alkyl group having 1 to 4 carbon atoms or an aryl group having 6 to 10 carbon atoms; f, g and h represent numbers that make up the mass average molecular weight of the compound represented by the formula (2) to 3000 to 1,000,000.

Furthermore, the present invention is to provide a semiconductor device encapsulated by curing the curable composition for semiconductor encapsulation.

Effect of the Invention

The effect of the present invention is to provide a curable composition for semiconductor encapsulation which produces a cured product that is excellent in heat resistance, electrical insulation properties at high temperatures, flexibility and heat cycle resistance, and to provide a semiconductor device encapsulated by curing this curable composition.

BEST MODE(S) FOR CARRYING OUT THE INVENTION

Hereinafter, the present invention will be described in detail by way of preferred embodiments.
<Component (A)>
First, the SiH group-containing siloxane compound represented by the formula (1), which is the component (A), will be described.

In the formula (1), $Y^1$ represents a polysiloxane group represented by the formula (3). In this formula (3), $R^1$ to $R^3$ each independently represent an alkyl group having 1 to 4 carbon atoms; $R^4$ to $R^6$ each independently represent an aryl group having 6 to 10 carbon atoms; and $R^7$ to $R^{10}$ each independently represent an alkyl group having 1 to 4 carbon atoms, or an aryl group having 6 to 10 carbon atoms. Examples of the alkyl group having 1 to 4 carbon atoms include methyl, ethyl, propyl, isopropyl, butyl, secondary butyl, tertiary butyl, and isobutyl. In view of satisfactory heat resistance, methyl, ethyl and propyl are preferred, and methyl and ethyl are more preferred, while methyl is most preferred. Examples of the aryl group having 6 to 10 carbon atoms include phenyl, 2-methylphenyl, 3-methylphenyl, 4-methylphenyl, 2,4-dimethylphenyl, 2,6-dimethylphenyl, 2,4,6-trimethylphenyl, and 4-t-butylphenyl. In view of satisfactory heat resistance, phenyl is preferred.

In the formula (1), c, d and e represent numbers that make up the mass average molecular weight of the compound represented by the formula (1) to 3000 to 1,000,000. The unit of $SiR^3R^4$—O— has poorer flexibility than the unit of $SiR^1R^2$—O—, and has poorer heat resistance than the unit of $SiR^5R^6$—O—, and therefore, d is preferably the number zero (0). Furthermore, the unit of $SiR^5R^6$—O— has poorer flexibility than the others, and therefore, the ratio of e to the sum of c and d is preferably 0.5 or less, and more preferably 0.4 or less.

In the formula (1) or (3), the unit of $SiR^1R^2$—O—, the unit of $SiR^3R^4$—O—, and the unit of $SiR^5R^6$—O— are shown to be arranged in the form of blocks; however, the arrangement of these units may be in any of a block form and a random form, and a combination of portions in a block form and portions in a random form is also acceptable. However, from the viewpoint of enhancing heat resistance, a random form is preferred.

In the formula (1), $X^1$ represents a residue obtainable by excluding hydrogen atoms from the SiH groups of a compound having two SiH groups and having a molecular weight of 1000 or less. Examples of the compound having two SiH groups and having a molecular weight of 1000 or less include compounds represented by the following formula (5) or (6).

[Chemical Formula 5]

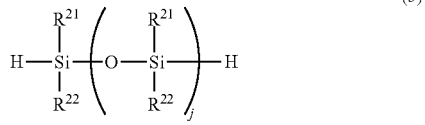

(5)

wherein $R^{21}$ and $R^{22}$ each independently represent an alkyl group having 1 to 4 carbon atoms or an aryl group having 6 to 10 carbon atoms; j represents a number from 0 to 6.

[Chemical Formula 6]

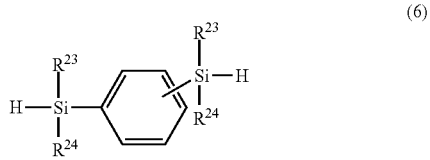

(6)

wherein $R^{23}$ and $R^{24}$ each independently represent an alkyl group having 1 to 4 carbon atoms or an aryl group having 6 to 10 carbon atoms.

In the formula (5), $R^{21}$ and $R^{22}$ each independently represent an alkyl group having 1 to 4 carbon atoms, or an aryl group having 6 to 10 carbon atoms. Examples of the alkyl group having 1 to 4 carbon atoms include methyl, ethyl, propyl, isopropyl, butyl, secondary butyl, tertiary butyl, and isobutyl, and examples of the aryl group having 6 to 10 carbon atoms include phenyl, 2-methylphenyl, 3-methylphenyl, 4-methylphenyl, 2,4-dimethylphenyl, 2,6-dimethylphenyl, 2,4,6-trimethylphenyl, and 4-t-butylphenyl. As for $R^{21}$ and $R^{22}$, methyl, ethyl, propyl and phenyl are preferred, and methyl and phenyl are more preferred, while methyl is most preferred. j represents a number from 0 to 6. In view of easy industrial availability, j is preferably a number from 3 to 5, more preferably a number of 3 or 4, and most preferably the number 4.

Among the compounds represented by the formula (5), preferred compounds include dimethylsilane, diethylsilane, methylphenylsilane, ethylphenylsilane, diphenylsilane, 1,1,3,3-tetramethyldisiloxane, 1,1,3,3-tetraethyldisiloxane, 1,1,3,3-tetraphenyldisiloxane, 1,1,3,3,5,5-hexamethyltrisiloxane, 1,1,3,3,5,5-hexaethyltrisiloxane, 1,1,3,3,5,5-hexaphenyltrisiloxane, and 1,1,3,3,5,5,7,7-octamethyltetrasiloxane. Among these, 1,1,3,3-tetramethyldisiloxane, 1,1,3,3-tetraethyldisiloxane, and 1,1,3,3,5,5-hexamethyltrisiloxane are preferred, and 1,1,3,3-tetramethyldisiloxane is more preferred.

In the formula (6), $R^{23}$ and $R^{24}$ each independently represent an alkyl group having 1 to 4 carbon atoms, or an aryl group having 6 to 10 carbon atoms, and examples of the alkyl group having 1 to 4 carbon atoms or the aryl group having 6 to 10 carbon atoms include the groups listed as examples in the descriptions for $R^{21}$ and $R^{22}$. As for $R^{23}$ and $R^{24}$, in view of satisfactory heat resistance, methyl and ethyl are preferred, and methyl is more preferred.

Among the compounds represented by the formula (6), preferred compounds include 1,2-bis(dimethylsilyl)benzene, 1,3-bis(dimethylsilyl)benzene, 1,4-bis(dimethylsilyl)benzene, 1,2-bis(diethylsilyl)benzene, 1,3-bis(diethylsilyl)benzene, and 1,4-bis(diethylsilyl)benzene. Among these, 1,2-bis(dimethylsilyl)benzene and 1,4-bis(dimethylsilyl)benzene are preferred, and 1,4-bis(dimethylsilyl)benzene is more preferred.

From the viewpoint that the resulting cured product acquires enhanced heat resistance, $X^1$ is preferably a residue obtainable by excluding hydrogen atoms from the SiH groups of the compound represented by the formula (5).

In the formula (1), $X^2$ represents a residue obtainable by excluding hydrogen atoms from the SiH groups of a compound having two SiH groups and having a molecular weight of 1000 or less, or a residue obtainable by excluding vinyl groups from a compound having two vinyl groups and having a molecular weight of 1000 or less. Examples of the compound having two SiH groups and having a molecular weight of 1000 or less include the compound represented by the formulas (5) and (6). Examples of the compound having two vinyl groups and having a molecular weight of 1000 or less include the compounds represented by the following formulas (7) to (10).

[Chemical Formula 7]

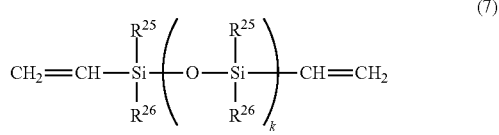

(7)

wherein $R^{25}$ and $R^{26}$ each independently represent an alkyl group having 1 to 4 carbon atoms or an aryl group having 6 to 10 carbon atoms; k represents a number from 0 to 6.

[Chemical Formula 8]

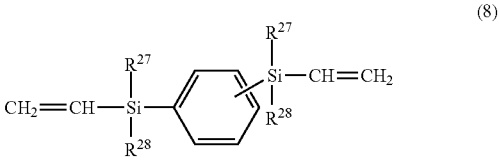

(8)

wherein $R^{27}$ and $R^{28}$ each independently represent an alkyl group having 1 to 4 carbon atoms or an aryl group having 6 to 10 carbon atoms.

[Chemical Formula 9]

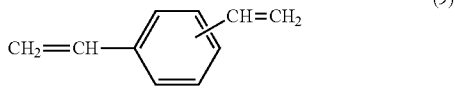

(9)

[Chemical Formula 10]

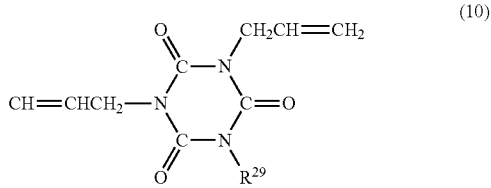

(10)

wherein $R^{29}$ represents an alkyl group having 1 to 4 carbon atoms or an aryl group having 6 to 10 carbon atoms.

In the formula (7), $R^{25}$ and $R^{26}$ each independently represent an alkyl group having 1 to 4 carbon atoms, or an aryl group having 6 to 10 carbon atoms. Examples of the alkyl group having 1 to 4 carbon atoms or the aryl group having 6 to 10 carbon atoms include the groups listed as examples in the descriptions for $R^{21}$ and $R^{22}$. As for $R^{25}$ and $R^{26}$, in view of satisfactory heat resistance, methyl, ethyl, propyl and phenyl are preferred, and methyl, ethyl and phenyl are more preferred, while methyl is most preferred. k represents a number from 0 to 6. In view of easy industrial availability, k is preferably a number from 0 to 2, and more preferably a number of 0 or 1.

Among the compounds represented by the formula (7), preferred compounds include dimethyldivinylsilane, diethyldivinylsilane, diphenyldivinylsilane, 1,1,3,3-tetramethyl-1,3-divinyldisiloxane, 1,1,3,3-tetraethyl-1,3-divinyldisiloxane, 1,1,3,3-tetraphenyl-1,3-divinyldisiloxane, 1,1,3,3,5,5-hexamethyl-1,5-divinyltrisiloxane, 1,1,3,3,5,5-hexaethyl-1,5-divinyltrisiloxane, 1,1,3,3,5,5-hexaphenyl-1,5-divinyltrisiloxane, and 1,1,3,3,5,5,7,7-octamethyl-1,7-divinyltetrasiloxane. Among these, 1,1,3,3-tetramethyl-1,3-divinyldisiloxane, 1,1,3,3-tetraethyl-1,3-divinyldisiloxane, and 1,1,3,3,5,5-hexamethyl-1,5-divinyltrisiloxane are preferred, and 1,1,3,3-tetramethyl-1,3-divinyldisiloxane are more preferred.

In the formula (8), $R^{27}$ and $R^{28}$ each independently represent an alkyl group having 1 to 4 carbon atoms, or an aryl group having 6 to 10 carbon atoms. Examples of the alkyl group having 1 to 4 carbon atoms or the aryl group having 6 to 10 carbon atoms include the groups listed as examples in the descriptions for $R^{21}$ and $R^{22}$. As for $R^{27}$ and $R^{28}$, in view of satisfactory heat resistance, methyl and ethyl are preferred, and methyl is more preferred.

Among the compounds represented by the formula (8), preferred compounds include 1,2-bis(dimethylvinylsilyl)benzene, 1,3-bis(dimethylvinylsilyl)benzene, 1,4-bis(dimethylvinylsilyl)benzene, 1,2-bis(diethylvinylsilyl)benzene, 1,3-bis(diethylvinylsilyl)benzene, and 1,4-bis(diethylvinylsilyl)benzene. Among these, 1,2-bis(dimethylvinylsilyl)benzene and 1,4-bis(dimethylvinylsilyl)benzene are preferred, and 1,4-bis(dimethylvinylsilyl)benzene is more preferred.

Examples of the compounds represented by the formula (9) include 1,2-divinylbenzene, 1,3-divinylbenzene, and 1,4-divinylbenzene.

In a compound represented by the formula (10), $R^{29}$ represents an alkyl group having 1 to 4 carbon atoms, or an aryl group having 6 to 10 carbon atoms. Examples of the alkyl group having 1 to 4 carbon atoms or the aryl group having 6 to 10 carbon atoms include the groups listed as examples in the descriptions for $R^{21}$ and $R^{22}$. As for $R^{29}$, in view of satisfactory heat resistance, methyl and ethyl are preferred, and methyl is more preferred.

Among the compounds represented by the formula (10), preferred compounds include diallylmethyl isocyanurate, and diallylethyl isocyanurate.

In the formula (1), when $X^2$ is a residue obtainable by excluding hydrogen atoms from the SiH groups of a compound having two SiH groups and having a molecular weight of 1000 or less, $X^1$ and $X^2$ may be identical groups, or may be different groups. However, from the viewpoint of facilitating the production, it is preferable that $X^1$ and $X^2$ be identical groups.

From the viewpoint that the amount of side products produced during the production is reduced, and the resulting cured product acquires satisfactory heat resistance, flexibility and the like, $X^2$ is preferably a residue obtainable by excluding hydrogen atoms from the SiH groups of a compound having two SiH groups and having a molecular weight of 1000 or less.

In the formula (1), a represents a number of 0 or 1, and from the viewpoint that the resulting cured product acquires satisfactory heat resistance, a is preferably the number zero (0).

In the formula (1), x represents a number from 0 to 10. x is preferably a number from 0 to 5, more preferably a number from 0 to 2, and most preferably the number zero (0).

When x is a number larger than 10, the compound represented by the formula (1) becomes highly viscous, so that handleability of the compound may deteriorate. Also, the content of the groups obtainable by the reaction between the SiH groups and the vinyl groups in the curable composition for semiconductor encapsulation of the present invention increases, so that the resulting curable may have insufficient heat resistance.

The mass average molecular weight of the compound represented by the formula (1) is 3000 to 1,000,000, preferably 5000 to 200,000, and even more preferably 7000 to 50,000.

If the mass average molecular weight of the compound represented by the formula (1) is smaller than 3000, the resulting cured product has insufficient heat resistance. If the mass average molecular weight is larger than 1,000,000, the compound represented by the formula (1) becomes highly viscous, and handleability thereof deteriorates.

According to the present invention, the mass average molecular weight refers to the mass average molecular weight obtained by performing an analysis by GPC (Gel Permeation Chromatography; also called gel penetration chromatography) using tetrahydrofuran as a solvent, and calculated relative to polystyrene standards. In general, a polymer compound may have a broad molecular weight distribution; however, in the present invention, since the resulting cured product may have insufficient heat resistance, the content of components having a mass average molecular weight of less than 1000 in the compound represented by the formula (1) is preferably 20% by mass or less, more preferably 5% by mass or less, and most preferably 0.5% by mass or less.

Meanwhile, the content of components having a mass average molecular weight of less than 1000 in the compound represented by the formula (1) can be calculated by a GPC analysis.

Furthermore, in regard to the siloxane compound represented by the formula (1), the proportion of the number of aryl groups each having 6 to 10 carbon atoms and bonded to silicon atoms, with respect to the sum of the number of alkyl groups each having 1 to 4 carbon atoms and bonded to silicon atoms, and the number of aryl groups each having 6 to 10 carbon atoms and bonded to silicon atoms, in one molecule is 0.05 to 0.5, preferably 0.07 to 0.45, more preferably 0.10 to 0.4, and most preferably 0.15 to 0.35. If this ratio is smaller than 0.05, the resulting cured product has insufficient heat resistance and insufficient electrical insulation properties at high temperatures. If the ratio is greater than 0.5, flexibility is insufficient.

Furthermore, in regard to the siloxane compound represented by the formula (1), the content of $Y^1$—$CH_2CH_2$ group is 0.2 mmol/g or less, preferably 0.01 mmol/g or less, and more preferably 0.005 mmol/g or less. If the content of the $Y^1$—$CH_2CH_2$ group in the siloxane compound represented by the formula (1) exceeds 0.2 mmol/g, the resulting cured product has insufficient heat resistance.

<Method for Producing Component (A)>

Next, a method for producing the compound represented by the formula (1), which is the component (A), will be described.

Among the compounds represented by the formula (1), a compound in which a represents the number zero and x is the number zero, is represented by the following formula (3h).

[Chemical Formula 11]

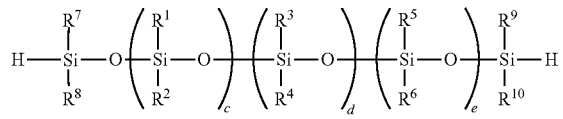

(3h)

wherein $R^1$ to $R^{10}$, c, d and e have the same meanings as those defined for the formula (3).

Among the compounds represented by the formula (1), a compound in which a is the number zero, $X^2$ is a residue obtainable by excluding vinyl groups from a compound having two vinyl groups and having a molecular weight of 1000 or less, and x is a number from 1 to 10, can be obtained by subjecting the SiH group of the compound represented by the formula (3h), and the vinyl group of the compound having two vinyl groups and having a molecular weight of 1000 or less, to a hydrosilylation reaction.

Among the compounds represented by the formula (1), a compound in which a is the number 1, $X^2$ is a residue obtainable by excluding hydrogen atoms from the SiH groups of a compound having two SiH groups and having a molecular weight of 1000 or less, and x is a number from 0 to 10, can be obtained by subjecting the SiH group of the compound having two SiH groups and having a molecular weight of 1000 or less, and the vinyl group of the compound represented by the following formula (3v), to a hydrosilylation reaction.

[Chemical Formula 12]

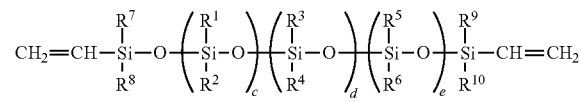

(3v)

wherein $R^1$ to $R^{10}$, c, d and e have the same meanings as those defined for the formula (3).

A polysiloxane compound represented by the formula: H—$Y^1$—H, that is, a compound represented by the formula (3h), and a polysiloxane compound represented by the formula: $CH_2$=CH—$Y^1$—CH=$CH_2$, that is, a compound represented by the formula (3v), are compounds having different terminal groups, and these compounds can be produced by similar methods.

Next, a method for producing the compound represented by the formula (3h) will be described. Examples of the method for producing the compound represented by the formula (3h) include: (3h-1) a method of subjecting a dihalosilane compound or a dialkoxysilane compound to a decomposition-polycondensation reaction through a sol-gel reaction, and then introducing SiH groups to both ends; (3h-2) a method of linking a cyclic siloxane compound to a starting material by ring-opening polymerization, and introducing SiH groups to the ends, and (3h-3) a method of inserting a cyclic siloxane compound to a siloxane compound having SiH groups at both ends, and subjecting the resultant to equilibration polymerization.

The method of (3h-1) is a method of subjecting a dihalosilane compound or a dialkoxysilane compound to a decomposition-polycondensation reaction through a sol-gel reaction to synthesize an intermediate polymer, and introducing SiH groups to the two ends of the intermediate polymer. The sol-gel reaction of the dihalosilane compound or the dialkoxysilane compound proceeds as a halosilane group or an alkoxysilane group is hydrolyzed in water or in an organic solvent containing water, to produce a silanol group (Si—OH group), and condensation occurs between the silanol groups thus produced, or between a silanol group and an alkoxysilyl group. Examples of the organic solvent include methanol, ethanol, n-propanol, isopropanol, n-butanol, isobutanol, acetone, methyl ethyl ketone, dioxane, and tetrahydrofuran. In order to accelerate the reaction, it is preferable to use a catalyst, and specific examples thereof include inorganic acids such as hydrochloric acid, phosphoric acid, and sulfuric acid; organic acids such as formic acid, acetic acid, oxalic acid, citric acid, methanesulfonic acid, benzenesulfonic acid, p-toluenesulfonic acid, and monoisopropyl phosphate; inorganic bases such as sodium hydroxide, potassium hydroxide, lithium hydroxide, and ammonia; and amine compounds (organic bases) such as trimethylamine, triethylamine, monoethanolamine, and diethanolamine. These may be used singly, or two or more kinds may be used in combination. The temperature of the decomposition-polycondensation reaction may vary with the type of the solvent, the type and amount of the catalyst, and the like, but the temperature is preferably 0 to 80° C., more preferably 5 to 50° C., and most preferably 8 to 30° C.

Examples of the dihalosilane compound or dialkoxysilane compound from which the unit of O—$SiR^1R^2$ is obtained, include dimethyldichlorosilane, diethyldichlorosilane, dipropyldichlorosilane, dibutyldichlorosilane, diisobutyldichlorosilane, methylethyldichlorosilane, methylpropyldichlorosilane, methylbutyldichlorosilane, methylisobutyldichlorosilane, dimethyldibromosilane, diethyldibromosilane, dipropyldibromosilane, dibutyldibromosilane, dimethyldimethoxysilane, diethyldimethoxysilane, dipropyldimethoxysilane, dibutyldimethoxysilane, diisobutyldimethoxysilane, dimethyldiethoxysilane, diethyldiethoxysilane, dipropyldiethoxysilane, dibutyldiethoxysilane, and diisobutyldiethoxysilane.

Examples of the dihalosilane compound or dialkoxysilane from which the unit of O—$SiR^3R^4$ is obtained, include methylphenyldichlorosilane, ethylphenyldichlorosilane, propylphenyldichlorosilane, butylphenyldichlorosilane, isobutylphenyldichlorosilane, methylphenyldibromosilane, ethylphenyldibromosilane, propylphenyldibromosilane, butylphenyldibromosilane, isobutylphenyldibromosilane, methylphenyldimethoxysilane, ethylphenyldimethoxysilane, propylphenyldimethoxysilane, butylphenyldimethoxysilane, and isobutylphenyldimethoxysilane.

Examples of the dihalosilane compound or dialkoxysilane compound from which the unit of O—$SiR^5R^6$ is obtained, include diphenyldichlorosilane, diphenyldibromosilane, diphenyldimethoxysilane, and diphenyldiethoxysilane.

There are no particular limitations on the method of introducing SiH groups to the two ends of the intermediate polymer obtained by the sol-gel reaction, but use may be made of a method of allowing the silanol groups at the ends of the intermediate polymer to react with a halosilane compound having a SiH group in the presence of pyridine, picoline or the like. As for such a halosilane compound having a SiH group, from the viewpoint of obtaining satisfactory heat resistance of the resulting cured product, dimethylchlorosilane, ethylmethylchlorosilane, diethylchlorosilane, methylphenylchlorosilane, ethylphenylchlorosilane, and diphenylchlorosilane are preferred, and dimethylchlorosilane, methylphenylchlorosilane, and diphenylchlorosilane are more preferred, while dimethylchlorosilane is most preferred.

The amount of use of the halosilane compound having a SiH group as mentioned above may be an equivalent amount or more relative to the amount of the silanol group, but the amount of use is preferably 2 to 30 equivalents, more preferably 3 to 20 equivalents, and most preferably 5 to 15 equivalents. The reaction temperature is preferably 40 to 120° C., more preferably 50 to 100° C., and most preferably 60 to 90° C.

The method of (3h-2) is a method of linking a cyclic siloxane compound to a starting material by ring-opening polymerization to synthesize an intermediate polymer, and introducing SiH groups to the ends of the intermediate polymer. Examples of the catalyst for the ring-opening polymerization include acid catalysts such as sulfuric acid; and base catalysts such as lithium, sodium and potassium. In view of easy control of the molecular weight, base catalysts are preferred, and in view of easy industrial availability, sodium and potassium are more preferred. Examples of the starting material include lower alcohol compounds such as methanol, ethanol, propanol, and isopropanol; disilanol compounds such as 1,1,3,3-tetramethyl-1,3-disilanediol, 1,3-dimethyl-1,3-diphenyl-1,3-disiloxanediol, 1,1,3,3-tetraphenyl-1,3-disiloxanediol, and 1,1,3,3,5,5-hexamethyl-1,5-trisiloxanediol; and silanol compounds having SiH groups, such as dimethylsilanol, ethylmethylsilanol, diethylsilanol, methylphenylsilanol, ethylphenylsilanol, and diphenylsilanol.

Meanwhile, when a cyclic siloxane is linked to a lower alcohol compound by ring-opening polymerization, the intermediate polymer has alkoxy groups at the ends. Therefore, in order to make SiH groups to react with the ends of the intermediate polymer, these alkoxy groups should be detached, and then SiH groups should be introduced. Lower alcohol compounds are industrially easily available, but have a disadvantage that when the lower alcohol compounds are used as the starting material, a process of detaching alkoxy groups is required, and the process becomes complicated. On the contrary, disilanol compounds and silanol compounds having SiH groups may not be industrially easily available, but they are preferable since detachment of the sites derived from the starting material is not required.

When the lower alcohol compounds, or the silane compounds and disilanol compounds described above are used as starting materials, and a base catalyst is used as the catalyst, the content of side products can be reduced. Therefore, it is preferable to use the base catalyst after converting the base catalyst into an alcoholate or silanolate of the base catalyst. The silanolate of a base catalyst and a disilanol compound or a silanol compound having a SiH group can be produced by, for example, a method described in GB Patent No. 631506 or U.S. Pat. No. 3,641,090.

Examples of the cyclic siloxane from which the unit of O—SiR$^1$R$^2$ is obtained include hexamethylcyclotrisiloxane, hexaethylcyclotrisiloxane, hexabutylcyclotrisiloxane, octamethylcyclotetrasiloxane, octaethylcyclotetrasiloxane, octapropylcyclotetrasiloxane, octaisopropylcyclotetrasiloxane, octabutylcyclotetrasiloxane, octaisobutylcyclotetrasiloxane, decamethylcyclopentasiloxane, decaethylcyclopentasiloxane, 2,4,6,8-tetraethyl-2,4,6,8-tetramethylcyclotetrasiloxane, and 2,4,6,8-tetrabutyl-2,4,6,8-tetramethylcyclotetrasiloxane.

Examples of the cyclic siloxane from which the unit of O—SiR$^3$R$^4$ is obtained include 2,4,6-trimethyl-2,4,6-triphenylcyclotrisiloxane, 2,4,6,8-tetramethyl-2,4,6,8-tetraphenylcyclotetrasiloxane, 2,4,6,8-tetraethyl-2,4,6,8-tetraphenylcyclotetrasiloxane, 2,4,6,8-tetrabutyl-2,4,6,8-tetraphenylcyclotetrasiloxane, 2,4,6,8,10-pentamethyl-2,4,6,8,10-pentaphenylcyclopentasiloxane, 2,2,4,6,8-pentamethyl-4,6,8-triphenylcyclotetrasiloxane, 2,2,4,4,6,8-hexamethyl-6,8-diphenylcyclotetrasiloxane, and 2,2,4,4,6,6,8-heptamethyl-6,8-phenylcyclotetrasiloxane.

Examples of the cyclic siloxane from which the unit of O—SiR$^5$R$^6$ is obtained include hexaphenylcyclotrisiloxane, octaphenylcyclotetrasiloxane, and decaphenylcyclopentasiloxane.

When a cyclic siloxane compound is linked to a starting material by ring-opening polymerization, if the reaction temperature is too high, side products are produced, and if the reaction temperature is too low, the reaction does not occur. Accordingly, the reaction temperature is preferably 80 to 250° C., more preferably 100 to 200° C., and most preferably 120 to 180° C. The reaction of linking a cyclic siloxane compound to a starting material by ring-opening polymerization may use, if necessary, dibutyl ether, toluene, xylene or the like as a catalyst. In the case of using a lower alcohol as the starting material and linking a cyclic siloxane compound thereto by ring-opening polymerization, the detachment of the alkoxy group derived from the starting material may be carried out by a publicly-known method, and for example, the detachment may be carried out by hydrolysis at 50 to 100° C. under acidic conditions provided by hydrochloric acid, sulfuric acid or the like.

In the case of producing the compound by the method of (3h-2), when SiH groups are introduced into the ends of the intermediate polymer, the SiH groups can be introduced by the same method as that described in connection with the method of (3h-1).

The method of (3h-3) is a method of inserting a cyclic siloxane compound to a siloxane compound having SiH groups at both ends, and subjecting the resultant to equilibration polymerization. Examples of the siloxane compound having SiH groups at both ends include 1,1,3,3-tetramethyldisiloxane, 1,3-dimethyl-1,3-diphenyldisiloxane, 1,1,3,3-tetraphenyldisiloxane, and 1,1,3,3,5,5-hexamethyltrisiloxane. Examples of the catalyst for the method of (3h-3) include acid catalysts such as sulfuric acid, methanesulfonic acid, trifluoromethanesulfonic acid, activated white clay, and sulfated zirconia; and base catalysts such as lithium hydroxide, sodium hydroxide, potassium hydroxide, and tetramethylammonium hydroxide. In view of satisfactory reactivity, base catalysts are preferred, and in view of easy availability of a catalyst with a less amount of impurities, potassium hydroxide is preferred. Examples the cyclic siloxane used in the method of (3h-3) include those cyclic siloxanes listed as examples for the method of (3h-2).

In regard to the method of (3h-3), in the case of using an acid catalyst, the reaction temperature for the cyclic siloxane is 40 to 150° C., and preferably 60 to 110° C., and in the case of using a base catalyst, the reaction temperature is 60 to 150° C., and preferably 70 to 120° C.

When the reaction is carried out with a base catalyst, it is preferable to use a bipolar aprotic solvent such as dimethylformamide, dimethylacetamide, N-methylpyrrolidone, tetrahydrofuran, dimethyl sulfoxide, or hexamethylphosphoric acid triamide, from the viewpoint that the reaction proceeds smoothly. In the case of using a bipolar aprotic solvent, the solvent may be used in combination with a hydrocarbon-based solvent such as toluene or xylene. Furthermore, when the reaction is carried out with a base catalyst, a portion of the reaction product has its ends converted to silanolates of the base catalyst. Therefore, it is preferable to introduce SiH groups to the ends by the same method as that described in connection with the method of (3h-1).

Among the production methods described above, the method of (3h-2) produces a less amount of side products, and is capable of easy control of the molecular weight. The method of (3h-3) is advantageous in terms of easy availability of raw materials and the simplicity of the production process. From this point of view, as the method for producing the compound represented by the formula (3h), the method of (3h-2) or the method of (3h-3) is preferred, and the method of (3h-3) is more preferred.

Next, the method for producing the compound represented by the formula (3v) will be described. Examples of the method for producing the compound represented by the formula (3v) include (3v-1) a method of subjecting a dihalosilane compound or a dialkoxysilane compound to a decomposition-polycondensation reaction through a sol-gel reaction, and then introducing vinyl groups to both ends, (3v-2) a method of linking a cyclic siloxane compound to a starting material by ring-opening polymerization, and introducing vinyl groups to the ends, and (3v-3) a method of inserting a cyclic siloxane compound into a siloxane compound having vinyl groups at both ends, and subjecting the resultant to equilibration polymerization.

As discussed above, the compound represented by the formula (3h) described above, and the compound represented by the formula (3v) are compounds having different end groups, and can be produced by similar methods. That is, the method of (3v-1), the method of (3v-2), and the method of (3v-3) described above are production methods similar to the method of (3h-1), the method of (3h-2), and the method of (3h-3), respectively.

The method of (3v-1) is a method of subjecting a dihalosilane compound or a dialkoxysilane compound to a decomposition-polycondensation reaction through a sol-gel reaction to synthesize an intermediate polymer, and introducing vinyl groups to the two ends of the intermediate polymer. The method of (3v-1) is a method similar to the method of (3h-1). Thus, under the same conditions as those in the method of (3h-1), an intermediate polymer can be obtained by a sol-gel reaction of a dihalosilane compound or a dialkoxysilane compound, and when vinyl groups are introduced into the ends of this intermediate polymer, the compound represented by the formula (3v) is obtained.

In regard to the method of (3v-1), there are no particular limitations on the method of introducing vinyl groups into both ends of the intermediate polymer obtained by the sol-gel reaction, but use may be made of a method of allowing the silanol groups at the ends of the intermediate polymer to react with a halosilane compound having vinyl groups in the presence of pyridine, picoline or the like. As for the halosilane compound having vinyl groups, from the viewpoint that the resulting cured product acquires satisfactory heat resistance, dimethylvinylchlorosilane, ethylmethylvinylchlorosilane, diethylvinylchlorosilane, methylphenylvinylchlorosilane, ethylphenylvinylchlorosilane, and diphenylvinylchlorosilane are preferred, and dimethylvinylchlorosilane, methylphenylvinylchlorosilane, and diphenylvinylchlorosilane are more preferred, while dimethylvinylchlorosilane is most preferred.

The amount of use of the halosilane compound having vinyl groups as described above may be an equivalent amount or more relative to the amount of the silanol groups, but the amount of use is preferably 2 to 30 equivalents, more preferably 3 to 20 equivalents, and most preferably 5 to 15 equivalents. The reaction temperature is preferably 40 to 120° C., more preferably 50 to 100° C., and most preferably 60 to 90° C.

The method of (3v-2) is a method of linking a cyclic siloxane compound to a starting material by ring-opening polymerization to synthesize an intermediate polymer, and introducing vinyl groups to the ends of the intermediate polymer. The method of (3v-2) is a method similar to the method of (3h-2). Thus, under the same conditions as those for the method of (3v-2) except that a silanol compound having vinyl groups is used instead of a silanol compound having SiH groups as the starting material, a cyclic siloxane compound is linked to the starting material by ring-opening polymerization, and if necessary, the sites derived from the starting material are detached. Thus, an intermediate polymer can be obtained. When vinyl groups are introduced into the ends of this intermediate polymer, the compound represented by the formula (3v) is obtained.

Examples of the silanol compound having vinyl groups as described above include dimethylvinylsilanol, ethylmethylvinylsilanol, diethylvinylsilanol, methylphenylvinylsilanol, ethylphenylvinylsilanol, and diphenylvinylsilanol.

In the case of producing the compound by the method of (3v-2), when vinyl groups are introduced into the ends of the intermediate polymer, the vinyl groups can be introduced by the same method as that described in connection with the method of (3v-1).

The method of (3v-3) is a method of inserting a cyclic siloxane compound into a siloxane compound having vinyl groups at both ends, and subjecting the resultant to equilibration polymerization. The method of (3v-3) is a method similar to the method of (3h-3), and the compound represented by the formula (3v) is obtained under the same conditions as those for the method of (3h-3), except that a siloxane compound having vinyl groups at both ends is used instead of a siloxane compound having SiH groups at both ends.

Examples of the siloxane compound having vinyl groups at both ends as described above include 1,1,3,3-tetramethyl-1,3-divinyldisiloxane, 1,3-dimethyl-1,3-diphenyl-1,3-divinyldisiloxane, 1,1,3,3-tetraphenyl-1,3-divinyldisiloxane, and 1,1,3,3,5,5-hexamethyl-1,5-divinyltrisiloxane.

Among the production methods described above, the method of (3v-2) produces a less amount of side products, and is capable of easy control of the molecular weight. The method of (3v-3) is advantageous in terms of easy availability of raw materials and the simplicity of the production process. From this point of view, as the method for producing the compound represented by the formula (3v), the method of 3h-2 and the method of (3v-3) are preferred, and the method of (3v-3) is more preferred.

The reaction between the SiH groups of a compound represented by the formula (3h) and the vinyl groups of a compound having two vinyl groups and having a molecular weight of 1000 or less, and the reaction between the vinyl groups of a compound represented by the formula (3v) and the SiH groups of a compound having two SiH groups and having a molecular weight of 1000 or less, may be carried out by a method conventionally known as a hydrosilylation reaction. The hydrosilylation reaction between SiH groups and vinyl groups is preferably carried out by using a hydrosilylation catalyst, and examples of the hydrosilylation catalyst include platinum-based catalysts, palladium-based catalysts, and rhodium-based catalysts. Examples of the platinum-based catalysts include chloroplatinic acid, a complex of chloroplatinic acid and an alcohol, an aldehyde, a ketone or the like, a platinum-olefin complex, a platinum-carbonylvinylmethyl complex (Ossko catalyst), a platinum-divinyltetramethyldisiloxane complex (Karstedt catalyst), a platinum-cyclovinylmethylsiloxane complex, a platinum-octyl aldehyde complex, a platinum-phosphine complex (for example, $Pt[P(C_6H_5)_3]_4$, $PtCl[P(C_6H_5)_3]_3$, or $Pt[P(C_4H_9)_3]_4$), a platinum-phosphite complex (for example, $Pt[P(OC_6H_5)_3]_4$, or $Pt[P(OC_4H_9)_3]_4$), and a dicarbonyldichloroplatinum. Examples of the palladium-based catalysts or rhodium-based catalysts include compounds containing palladium atoms or rhodium atoms instead of the platinum atoms of the above-described platinum-based catalysts. These may be used singly, or two or more kinds may be used in combination. As for the hydrosilylation catalyst, platinum-based catalysts are preferred in view of reactivity, and a platinum-divinyltetramethyldisiloxane complex and a platinum-carbonylvinylmethyl complex are more preferred, while a platinum-carbonylvinylmethyl complex is most preferred. Furthermore, in view of reactivity, the amount of use of the catalyst is preferably 5% by mass or less, more preferably 0.0001 to 1.0% by mass, and most preferably 0.001 to 0.1% by mass, relative to the total amount of the various raw materials. There are no particular limitations on the reaction conditions for hydrosilylation, and the reaction may be carried out under conventionally known conditions using the catalyst described above. However, in view of reaction rate, it is preferable to carry out the reaction at room temperature (25° C.) to 130° C., and conventionally known catalysts such as toluene, hexane, methyl isobutyl ketone, cyclopentanone, and propylene glycol monomethyl ether acetate may be used.

<Component (B)>

Next, the vinyl group-containing siloxane compound represented by the formula (2), which is the component (B), will be described.

In the formula (2), $Y^2$ represents a polysiloxane group represented by the following formula (4). In this formula (4), $R^{11}$ to $R^{13}$ each independently represent an alkyl group having 1 to 4 carbon atoms; $R^{14}$ to $R^{16}$ each independently represent an aryl group having 6 to 10 carbon atoms; and $R^{17}$ to $R^{20}$ each independently represent an alkyl group having 1 to 4 carbon atoms, or an aryl group having 6 to 10 carbon atoms. Examples of the alkyl group having 1 to 4 carbon atoms include those alkyl groups having 1 to 4 carbon atom described in the descriptions for $R^1$ to $R^3$. In view of satisfactory heat resistance, methyl, ethyl and propyl are preferred, and methyl and ethyl are more preferred, while methyl is most preferred. Examples of the aryl group having 6 to 10 carbon atoms include those aryl groups having 6 to 10 carbon atoms described in the descriptions for $R^4$ to $R^6$. In view of satisfactory heat resistance, phenyl is preferred. f, g and h represent numbers that make up the mass average molecular weight of the compound represented by the formula (2) to 3000 to 1,000,000.

In the formula (2), since the unit of $SiR^{13}R^{14}$—O— has poorer flexibility than the unit of $SiR^{11}R^{12}$—O—, and has poorer heat resistance than the unit of $SiR^{15}R^{16}$—O—, g is preferably the number zero. Furthermore, since the unit of $SiR^{15}R^{16}$—O— has poorer flexibility than the others, the ratio of h to the sum of f and g is preferably 0.5 or less, and more preferably 0.4 or less.

In the formula (2), the unit of $SiR^{11}R^{12}$—O—, the unit of $SiR^{13}R^{14}$—O—, and the unit of O—$SiR^{15}R^{16}$—O— are shown to be arranged in the form of blocks; however, the arrangement of these units may be in any of a block form and a random form, and a combination of portions in a block form and portions in a random form is also acceptable. However, from the viewpoint of enhancing heat resistance, a random form is preferred.

In the formula (2), $X^3$ represents a residue obtainable by excluding vinyl groups from a compound having two vinyl groups and having a molecular weight of 1000 or less. Examples of the compound having two vinyl groups and having a molecular weight of 1000 or less include the compounds represented by the formulas (7) to (10).

In the formula (2), $X^4$ represents a residue obtainable by excluding vinyl groups from a compound having two vinyl groups and having a molecular weight of 1000 or less, or a residue obtainable by excluding hydrogen atoms from the SiH groups of a compound having two SiH groups and having a molecular weight of 1000 or less. Examples of the compound having two vinyl groups and having a molecular weight of 1000 or less include those compounds represented by the formulas (7) to (10), and examples of the compound having two SiH groups and having a molecular weight of 1000 or less include those compounds represented by the formula (5) and (6).

When $X^4$ is a residue obtainable by excluding vinyl groups from a compound having two vinyl groups and having a molecular weight of 1000 or less, $X^3$ and $X^4$ may be identical groups, and may be different groups. However, from the viewpoint that the production of the compound is facilitated, it is preferable that the groups be identical groups.

From the viewpoint that no side products are produced in the production process, and the resulting cured product acquires satisfactory heat resistance, flexibility and the like, $X^4$ is preferably a residue obtainable by excluding vinyl groups from a compound having two vinyl groups and having a molecular weight of 1000 or less.

In the formula (2), b represents a number of 0 or 1, and in view of satisfactory heat resistance, b is preferably the number zero.

In the formula (2), y represents a number from 0 to 10. y is preferably a number from 0 to 5, more preferably a number from 0 to 2, and most preferably the number zero. If y is a number greater than 10, the compound represented by the formula (2) becomes highly viscous, so that handleability may deteriorate, or the content of the groups obtainable by a reaction between the SiH groups and the vinyl groups in the curable composition for semiconductor encapsulation of the present invention, and the resulting cured product may have insufficient heat resistance.

The mass average molecular weight of the compound represented by the formula (2) is 3000 to 1,000,000, preferably 5000 to 200,000, and more preferably 7000 to 50,000. If the mass average molecular weight of the compound represented by the formula (2) is smaller than 3000, the resulting cured product has insufficient heat resistance, and if the mass average molecular weight is greater than 1,000,000, the compound represented by the formula (2) becomes highly viscous, and handleability deteriorates. In general, a polymer compound may have a broad molecular weight distribution; however, since the resulting cured product has insufficient heat resistance in the present invention, the content of components having a mass average molecular weight of smaller than 1000 in the compound represented by the formula (2), is preferably 20% by mass or less, more preferably 5% by mass or less, and most preferably 0.5% by mass or less.

Meanwhile, the content of components having a mass average molecular weight of less than 1000 in the compound represented by the formula (2) can be calculated by a GPC analysis.

In the siloxane compound represented by the formula (2), the proportion of the number of aryl groups each having 6 to 10 carbon atoms and bonded to silicon atoms, with respect to the sum of the number of alkyl groups each having 1 to 4 carbon atoms and bonded to silicon atoms and the number of aryl groups each having 6 to 10 carbon atoms and bonded to silicon atoms in one molecule, is 0.05 to 0.5, preferably 0.07 to 0.45, more preferably 0.10 to 0.4, and most preferably 0.15 to 0.35. If this proportion is smaller than 0.05, the resulting cured product has insufficient heat resistance and electrical insulation properties at high temperatures. If the proportion is larger than 0.5, the resulting cured product has insufficient flexibility.

Furthermore, in the siloxane compound represented by the formula (2), the sum of the contents of $Y^2$—$CH_2CH_2$ groups and vinyl groups is 0.002 to 0.7 mmol/g, preferably 0.002 to 0.4 mmol/g, and more preferably 0.002 to 0.2 mmol/g. If the sum of the contents of $Y^2$—$CH_2CH_2$ groups and vinyl groups is smaller than 0.002 mmol/g, the compound represented by the formula (2) becomes highly viscous, and handleability deteriorates. If the sum of the contents exceeds 0.7 mmol/g, the resulting cured product has insufficient heat resistance.

<Method for Producing Component (B)>

Next, a method for producing the compound represented by the formula (2), which is the component (B), will be described.

Among the compounds represented by the formula (2), a compound in which b is the number zero and y is the number zero, is represented by the following formula (4v).

[Chemical Formula 13]

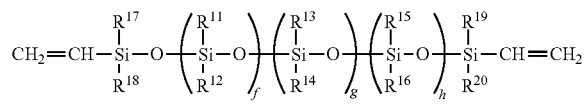

(4v)

wherein $R^{11}$ to $R^{20}$, f, g and h have the same meanings as those defined for the formula (4).

Among the compounds represented by the formula (2), a compound in which b is the number zero, $X^4$ is a residue obtainable by excluding hydrogen atoms from the SiH groups of a compound having two SiH groups and having a molecular weight of 1000 or less, and y is a number from 1 to 10, can be obtained by subjecting the vinyl groups of a compound represented by the formula (4v) and the SiH groups of a compound having two SiH groups and having a molecular weight of 1000 or less, to a hydrosilylation reaction.

Among the compounds represented by the formula (2), a compound in which b is the number 1, $X^4$ is a residue obtainable by excluding vinyl groups from a compound having two vinyl groups and having a molecular weight of 1000 or less, and x is a number from 0 to 10, can be obtained by allowing the SiH groups of a compound represented by the following formula (4h) and the vinyl groups of a compound having two vinyl groups and having a molecular weight of 1000 or less, to react with each other.

[Chemical Formula 14]

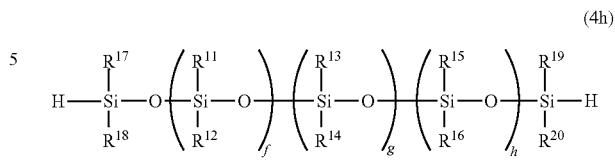

(4h)

wherein $R^{11}$ to $R^{20}$, f, g and h have the same meanings as those defined for the formula (4).

The compound represented by the formula (4v) is the same compound as the compound represented by the formula (3v), and can be produced by the methods of (3v-1) to (3v-3) described above, or the like. Among the production methods discussed above, the method of (3v-2) produces a less amount of side products and is capable of easy control of the molecular weight, and the method of (3v-3) is advantageous in terms of easy availability of raw materials and the simplicity of the production process. From this viewpoint, as the method for producing the compound represented by the formula (4v), the method of (3v-2) or the method of (3v-3) is preferred, and the method of (3v-3) is more preferred.

The compound represented by the formula (4h) is the same compound as the compound represented by the formula (3h), and can be produced by the methods of (3h-1) to (3h-3), or the like. Among the production methods discussed above, the method of (3h-2) produces a less amount of side products and is capable of easy control of the molecular weight, and the method of (3h-3) is advantageous in terms of easy availability of raw materials and the simplicity of the production process. From this viewpoint, as the method for producing the compound represented by the formula (4h), the method of (3h-2) or the method of (3h-3) is preferred, and the method of (3h-3) is more preferred.

The reaction between the vinyl groups of a compound represented by the formula (4v) and the SiH groups of a compound having two SiH groups and having a molecular weight of 1000 or less, or the reaction between the SiH groups of a compound represented by the formula (4h) and the vinyl groups of a compound having two vinyl groups and a molecular weight of 1000 or less, may be carried out by a method conventionally known as a hydrosilylation reaction, in the same manner as in the case of the component (A).

<Component (C)>

Next, the component (C) will be described.

The component (C) used in the curable composition for semiconductor encapsulation of the present invention is a compound having at least three SiH groups or at least three vinyl groups. Examples of the compound having at least three SiH groups include compounds of the following formulas (11) to (14).

[Chemical Formula 15]

(11)

wherein $R^{30}$ represents an alkyl group having 1 to 4 carbon atoms or an aryl group having 6 to 10 carbon atoms; m represents a number from 3 to 6.

[Chemical Formula 16]

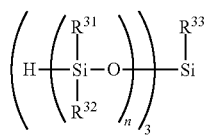
(12)

wherein $R^{31}$ to $R^{33}$ each independently represent an alkyl group having 1 to 4 carbon atoms or an aryl group having 6 to 10 carbon atoms; n represents a number from 0 to 1000.

[Chemical Formula 17]

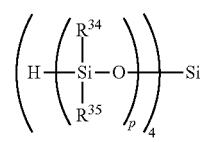
(13)

wherein $R^{34}$ and $R^{35}$ each independently represent an alkyl group having 1 to 4 carbon atoms or an aryl group having 6 to 10 carbon atoms; p represents a number from 1 to 1000.

[Chemical Formula 18]

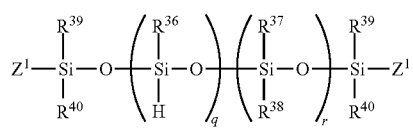
(14)

wherein $R^{36}$ to $R^{40}$ each independently represent an alkyl group having 1 to 4 carbon atoms, or an aryl group having 6 to 10 carbon atoms; $Z^1$ represents a hydrogen atom, an alkyl group having 1 to 4 carbon atoms, or an aryl group having 6 to 10 carbon atoms; q represents a number from 1 to 1000; and r represents a number from 0 to 1000. However, when q is a number of 1 or 2, $Z^1$ represents a hydrogen atom.

In the formula (11), $R^{30}$ represents an alkyl group having 1 to 4 carbon atoms, or an aryl group having 6 to 10 carbon atoms. Examples of the alkyl group having 1 to 4 carbon atoms or the aryl group having 6 to 10 carbon atoms include the groups listed as examples in the descriptions for $R^{21}$ and $R^{22}$. As for $R^{30}$, in view of satisfactory heat resistance, methyl, ethyl, propyl and phenyl are preferred, and methyl and phenyl are more preferred. m represents a number from 3 to 6. In view of easy industrial availability, m is preferably a number from 3 to 5, more preferably a number of 3 or 4, and most preferably the number 4.

Among the compounds represented by the formula (11), preferred compounds include 2,4,6-trimethylcyclotrisiloxane, 2,4,6-triethylcyclotrisiloxane, 2,4,6-triphenylcyclotrisiloxane, 2,4,6,8-tetramethylcyclotetrasiloxane, 2,4,6,8-tetraethylcyclotetrasiloxane, 2,4,6,8-tetraphenylcyclotetrasiloxane, 2,4,6,8,10-pentamethylcyclopentasiloxane, 2,4,6,8,10-pentaethylcyclopentasiloxane, 2,4,6,8,10-pentaphenylcyclopentasiloxane, 2,4,6,8,10,12-hexamethylcyclohexasiloxane, 2,4,6,8,10,12-hexaethylcyclohexasiloxane, and 2,4,6,8,10,12-hexaphenylcyclohexasiloxane. Among these, in view of easy industrial availability, 2,4,6,8-tetramethylcyclotetrasiloxane and 2,4,6,8,10-pentamethylcyclopentasiloxane are preferred, and 2,4,6,8-tetramethylcyclotetrasiloxane is more preferred.

In the formula (12), $R^{31}$ to $R^{33}$ each represent an alkyl group having 1 to 4 carbon atoms or an aryl group having 6 to 10 carbon atoms, and examples of the alkyl group having 1 to 4 carbon atoms or the aryl group having 6 to 10 carbon atoms include those groups listed as examples in the descriptions for $R^{21}$ and $R^{22}$. As for $R^{31}$ to $R^{33}$, in view of satisfactory heat resistance, methyl, ethyl, propyl and phenyl are preferred, and methyl and phenyl are more preferred. n represents a number from 0 to 1000. n is preferably a number from 0 to 500, more preferably a number from 1 to 200, and most preferably a number from 1 to 100.

In the formula (13), $R^{34}$ and $R^{35}$ each represent an alkyl group having 1 to 4 carbon atoms or an aryl group having 6 to 10 carbon atoms, and examples of the alkyl group having 1 to 4 carbon atoms or the aryl group having 6 to 10 carbon atoms include those groups listed as examples in the descriptions for $R^{21}$ and $R^{22}$. As for $R^{34}$ and $R^{35}$, in view of satisfactory heat resistance, methyl, ethyl, propyl and phenyl are preferred, and methyl and phenyl are more preferred. p represents a number from 1 to 1000. p is preferably a number from 1 to 500, more preferably a number from 1 to 200, and most preferably a number from 1 to 100.

In the formula (14), $R^{36}$ to $R^{40}$ each represent an alkyl group having 1 to 4 carbon atoms or an aryl group having 6 to 10 carbon atoms, and examples of the alkyl group having 1 to 4 carbon atoms or the aryl group having 6 to 10 carbon atoms include those groups listed as examples in the descriptions for $R^{21}$ and $R^{22}$. As for $R^{36}$ to $R^{40}$, in view of satisfactory heat resistance, methyl, ethyl, propyl and phenyl are preferred, and methyl and phenyl are more preferred. $Z^1$ represents a hydrogen atom, an alkyl group having 1 to 4 carbon atoms, or an aryl group having 6 to 10 carbon atoms. Examples of the alkyl group having 1 to 4 carbon atoms or the aryl group having 6 to 10 carbon atoms include those groups listed as examples in the descriptions for $R^{21}$ and $R^{22}$. As for $Z^1$, from the viewpoint that the resulting cured product acquires enhanced flexibility, a hydrogen atom and methyl are preferred, and a hydrogen atom is more preferred. q represents a number from 1 to 1000, and r represents a number from 0 to 1000. However, when q is a number of 1 or 2, $Z^1$ represents a hydrogen atom. If q is an excessively large number, the flexibility or heat resistance of the resulting cured product may deteriorate. Therefore, q is preferably a number from 1 to 50, more preferably a number from 1 to 30, and preferably a number from 1 to 20. From the viewpoint that the resulting cured product acquires enhanced flexibility, the ratio of r to q is preferably 0.5 to 20, and more preferably 1 to 10.

Examples of the compound having at least three vinyl groups as described above include polyvinylbenzene compounds such as 1,2,4-trivinylbenzene, 1,3,5-trivinylbenzene, and 1,2,3,4-tetravinylbenzene; polyvinylcyclohexane compounds such as 1,2,4-trivinylcyclohexane; triallyl isocyanurate, 1,2-bis(trivinylsilyl)ethane, and compounds of the following formulas (15) to (18).

[Chemical Formula 19]

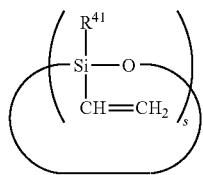

(15)

wherein $R^{41}$ represents an alkyl group having 1 to 4 carbon atoms or an aryl group having 6 to 10 carbon atoms; s represents a number from 3 to 6.

[Chemical Formula 20]

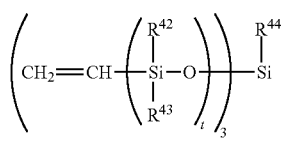

(16)

wherein $R^{42}$ to $R^{44}$ each independently represent an alkyl group having 1 to 4 carbon atoms or an aryl group having 6 to 10 carbon atoms; t represents a number from 0 to 1000.

[Chemical Formula 21]

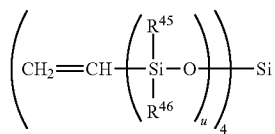

(17)

wherein $R^{45}$ and $R^{46}$ each independently represent an alkyl group having 1 to 4 carbon atoms or an aryl group having 6 to 10 carbon atoms; u represents a number from 0 to 1000.

[Chemical Formula 22]

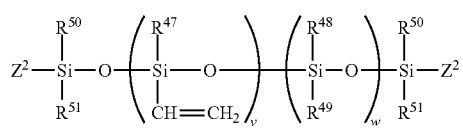

(18)

wherein $R^{47}$ to $R^{51}$ each independently represent an alkyl group having 1 to 4 carbon atoms, or an aryl group having 6 to 10 carbon atoms; $Z^2$ represents a vinyl group, an alkyl group having 1 to 4 carbon atoms, or an aryl group having 6 to 10 carbon atoms; v represents a number from 1 to 1000; and w represents a number from 0 to 1000. However, when q is a number of 1 or 2, $Z^2$ represents a vinyl group.

In the formula (15), $R^{41}$ represents an alkyl group having 1 to 4 carbon atoms or an aryl group having 6 to 10 carbon atoms, and examples of the alkyl group having 1 to 4 carbon atoms or the aryl group having 6 to 10 carbon atoms include those groups listed as examples in the descriptions for $R^{21}$ and $R^{22}$. As for $R^{41}$, in view of satisfactory heat resistance, methyl, ethyl, propyl and phenyl are preferred, and methyl and phenyl are more preferred. s represents a number from 3 to 6. In view of easy industrial availability, s is preferably a number from 3 to 5, more preferably a number from 3 to 4, and most preferably the number 4.

Among the compounds represented by the formula (15), preferred compounds include 2,4,6-trimethyl-2,4,6-trivinylcyclotrisiloxane, 2,4,6-triethyl-2,4,6-trivinylcyclotrisiloxane, 2,4,6-triphenyl-2,4,6-trivinylcyclotrisiloxane, 2,4,6,8-tetramethyl-2,4,6,8-tetravinylcyclotetrasiloxane, 2,4,6,8-tetraethyl-2,4,6,8-tetravinylcyclotetrasiloxane, 2,4,6,8-tetraphenyl-2,4,6,8-tetravinylcyclotetrasiloxane, 2,4,6,8,10-pentamethyl-2,4,6,8,10-pentavinylcyclopentasiloxane, 2,4,6,8,10-pentaethyl-2,4,6,8,10-pentavinylcyclopentasiloxane, 2,4,6,8,10-pentaphenyl-2,4,6,8,10-pentavinylcyclopentasiloxane, and 2,4,6,8,10,12-hexamethyl-2,4,6,8,10,12-hexavinylcyclohexasiloxane. Among these, in view of easy industrial availability, 2,4,6,8-tetramethyl-2,4,6,8-tetravinylcyclotetrasiloxane and 2,4,6,8,10-pentamethyl-2,4,6,8,10-pentavinylcyclopentasiloxane are preferred, and 2,4,6,8-tetramethyl-2,4,6,8-tetravinylcyclotetrasiloxane are more preferred.

In the formula (16), $R^{42}$ to $R^{44}$ each represent an alkyl group having 1 to 4 carbon atoms or an aryl group having 6 to 10 carbon atoms, and examples of the alkyl group having 1 to 4 carbon atoms or the aryl group having 6 to 10 carbon atoms include those groups listed as examples in the descriptions for $R^{21}$ and $R^{22}$. As for $R^{42}$ to $R^{44}$, in view of satisfactory heat resistance, methyl, ethyl, propyl and phenyl are preferred, and methyl and phenyl are more preferred. t represents a number from 0 to 1000. t is preferably a number from 0 to 500, more preferably a number from 1 to 200, and most preferably a number from 1 to 100.

In the formula (17), $R^{45}$ and $R^{46}$ each represent an alkyl group having 1 to 4 carbon atoms or an aryl group having 6 to 10 carbon atoms, and examples of the alkyl group having 1 to 4 carbon atoms or the aryl group having 6 to 10 carbon atoms include those groups listed as examples in the descriptions for $R^{21}$ and $R^{22}$. As for $R^{45}$ and $R^{46}$, in view of satisfactory heat resistance, methyl, ethyl, propyl and phenyl are preferred, and methyl and phenyl are more preferred. u represents a number from 1 to 1000. u is preferably a number from 1 to 500, more preferably a number from 1 to 200, and most preferably a number from 1 to 100.

In the formula (18), $R^{47}$ to $R^{51}$ each represent an alkyl group having 1 to 4 carbon atoms, or an aryl group having 6 to 10 carbon atoms, and examples of the alkyl group having 1 to 4 carbon atoms or the aryl group having 6 to 10 carbon atoms include those groups listed as examples in the descriptions for $R^{21}$ and $R^{22}$. As for $R^{47}$ to $R^{51}$, in view of satisfactory heat resistance, methyl, ethyl, propyl and phenyl are preferred, and methyl and phenyl are more preferred. $Z^2$ represents a vinyl group, an alkyl group having 1 to 4 carbon atoms, or an aryl group having 6 to 10 carbon atoms. Examples of the alkyl group having 1 to 4 carbon atoms or the aryl group having 6 to 10 carbon atoms include those groups listed as examples in the descriptions for $R^{21}$ and $R^{22}$. As for $Z^2$, from the viewpoint that the resulting cured product acquires enhanced flexibility, methyl and vinyl are preferred, and vinyl is more preferred. v represents a number from 1 to 1000, and w represents a number from 0 to 1000. However, when v is a number of 1 or 2, $Z^2$ represents a vinyl group. If v is an excessively large number, the flexibility or heat resistance of the resulting cured product may deteriorate. Therefore, v is preferably a number from 1 to 50, more preferably a number from 1 to 30, and preferably a number from 1 to 20. From the viewpoint that the resulting cured product acquires enhanced flexibility, the ratio of w to v is preferably 0.5 to 20, and more preferably 1 to 10.

In addition to these, other examples of the component (C) include reaction products which are reaction products of the compounds exemplified hitherto as the component (C) and other compounds, and respectively have at least three SiH groups or at least three vinyl groups in the molecule. Examples of such other compounds include a SiH group-containing siloxane compound represented by the formula (1), a vinyl group-containing siloxane compound represented by the formula (2), and compounds represented by the formulas (5) to (10). From the viewpoint that the resulting cured product acquires enhanced flexibility, a SiH group-containing siloxane compound represented by the formula (1), and a vinyl group-containing siloxane compound represented by the formula (2) are preferred, and among others, a compound represented by the formula (3h) and a compound represented by the formula (4v) are preferred. From the viewpoint that the resulting cured product acquires enhanced heat resistance, the molecular weight of the component (C) is, as the mass average molecular weight, preferably 1000 to 1,000,000, more preferably 3000 to 200,000, and most preferably 5000 to 50,000.

Among the components (C) described above, from the viewpoint of obtaining a cured product having excellent flexibility, preferred examples include reaction products which are the reaction products of compounds represented by the formulas (11) to (13) and compounds represented by the formula (4v), and have at least three SiH groups; and reaction products which are the reaction products of compounds represented by the formulas (15) to (17) and compounds represented by the formula (3h), and have at least three vinyl groups. More preferred examples include reaction products which are the reaction products of compounds represented by the formula (11) and compounds represented by the formula (4v), and have at least three SiH groups; and reaction products which are the reaction products of compounds represented by the formula (15) and compounds represented by the formula (3h), and have at least three vinyl groups. A compound obtained by allowing 2 moles of a compound represented by the formula (11) to react with 1 mole of a compound represented by the formula (4v), and a compound obtained by allowing 2 moles of a compound represented by the formula (15) to react with 1 mole of a compound represented by the formula (3h), are most preferred.

The compound obtained by allowing 2 moles of a compound represented by the formula (11) to react with 1 mole of a compound represented by the formula (4v), is a compound represented by the following formula (19), and the compound obtained by allowing 2 moles of a compound represented by the formula (15) to react with 1 mole of a compound represented by the formula (3h), is a compound represented by the following formula (20).

[Chemical Formula 23]

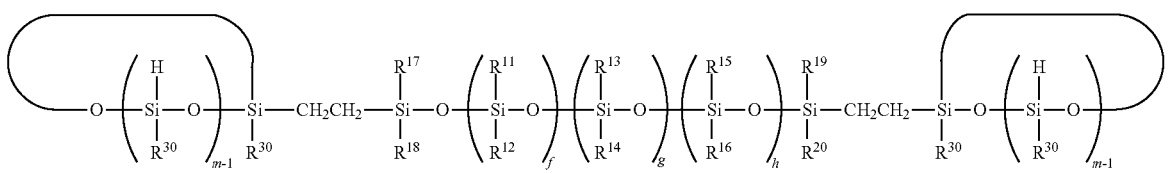

(19)

wherein $R^{30}$ and m have the same meanings as those defined for the formula (11); $R^{11}$ to $R^{20}$, g, f, g and h have the same meanings as those defined for the formula (4).

[Chemical Formula 24]

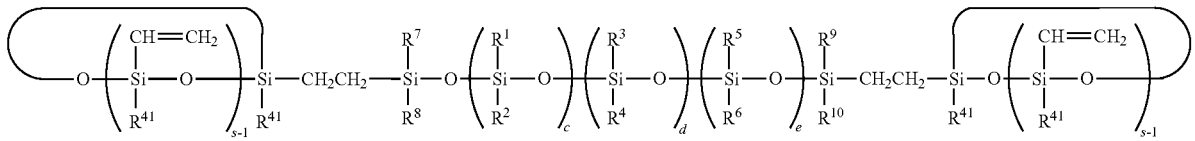

wherein $R^{41}$ and s have the same meanings as those defined for the formula (15); $R^1$ to $R^{10}$, c, d, and e have the same meanings as those defined for the formula (3).

<Component (D)>

Next, the hydrosilylation catalyst, which is the component (D), will be described.

The hydrosilylation catalyst is not particularly limited as long as it has a catalytic activity for a hydrosilylation reaction, and any known compound can be used. Examples of such a catalyst include a platinum-based catalyst, a palladium-based catalyst, and a rhodium-based catalyst. Examples of the platinum-based catalyst include chloroplatinic acid, a complex of chloroplatinic acid and an alcohol, an aldehyde, a ketone or the like, a platinum-olefin complex, a platinum-carbonylvinylmethyl complex (Ossko catalyst), a platinum-divinyltetramethyldisiloxane complex (Karstedt catalyst), a platinum-cyclovinylmethylsiloxane complex, a platinum-octyl aldehyde complex, a platinum-phosphine complex (for example, $Pt[P(C_6H_5)_3]_4$, $PtCl[P(C_6H_5)_3]_3$, or $Pt[P(C_4H_9)_3]_4$), a platinum-phosphite complex (for example, Pt[P ($OC_6H_5)_3]_4$, or $Pt[P(OC_4H_9)_3]_4$), and a dicarbonyldichloroplatinum. Examples of the palladium-based catalysts or rhodium-based catalysts include compounds containing palladium atoms or rhodium atoms instead of the platinum atoms of the above-described platinum-based catalysts. These may be used singly, or two or more kinds may be used in combination. As for the hydrosilylation catalyst, platinum-based catalysts are preferred in view of reactivity, and a platinum-divinyltetramethyldisiloxane complex and a platinum-carbonylvinylmethyl complex are more preferred, while a platinum-carbonylvinylmethyl complex is most preferred.

The curable composition for semiconductor encapsulation of the present invention is cured as a result of the hydrosilylation between the SiH groups and the vinyl groups contained in the components (A), (B) and (C). However, in order to obtain a cured product having satisfactory flexibility, the proportion of the vinyl groups with respect to the SiH groups is, as a molar ratio, preferably 0.5 to 2, more preferably 0.7 to 1.4, and most preferably 0.8 to 1.25.

In the curable composition for semiconductor encapsulation of the present invention, the contents of the components (A), (B) and (C) may be determined such that the proportion of the vinyl groups and the SiH groups contained in these various components is in the range described above.

However, the component (C) functions as a crosslinking agent, and if the content of the component (C) is either excessively small or excessively large, the curable composition for semiconductor encapsulation of the present invention cannot exhibit sufficient effects as an encapsulating material/insulating material. Thus, the content of the component (C) is preferably 0.01 to 10% by mass, more preferably 0.02 to 5% by mass, and most preferably 0.05 to 2% by mass, relative to the total amount of the components (A) and (B).

The content of the catalyst as the component (D) is preferably 0.0001 to 5% by mass, more preferably 0.0005 to 1.0% by mass, and most preferably 0.001 to 0.1% by mass, relative to the total amount of the components (A), (B) and (C).

Furthermore, if the sum of the contents of vinyl groups, $Y^1$—$CH_2CH_2$ groups, $Y^2$—$CH_2CH_2$ groups, and groups that are obtainable through a reaction between vinyl groups and SiH groups, in the cured product obtained by curing the curable composition for semiconductor encapsulation of the present invention is excessively large, the resulting cured product may have insufficient heat resistance. On the other hand, if a high molecular weight polysiloxane is used, the content of the groups obtainable through a reaction between vinyl groups and SiH groups and the content of unreacted vinyl groups in the cured product can be decreased; however, there is a problem of deteriorated handleability. For this reason, the sum of the contents of vinyl groups, $Y^1$—$CH_2CH_2$ groups, $Y^2$—$CH_2CH_2$ groups, and groups that are obtainable through a reaction between vinyl groups and SiH groups, relative to the total mass of the components (A), (B) and (C), is preferably 0.005 to 0.5 mmol/g, more preferably 0.01 to 0.3 mmol/g, and most preferably 0.02 to 0.2 mmol/g. Meanwhile, in the present invention, the vinyl group, $Y^1$—$CH_2CH_2$ groups, $Y^2$—$CH_2CH_2$ groups, and the groups obtainable through a reaction between vinyl groups and SiH groups may be collectively referred to as heat resistance affecting groups, and the contents of the vinyl group, $Y^1$—$CH_2CH_2$ groups, $Y^2$—$CH_2CH_2$ groups, and the groups obtainable through a reaction between vinyl groups and SiH groups relative to the total mass of the components (A), (B) and (C) may be referred to as the content of heat resistance affecting groups.

The curable composition for semiconductor encapsulation of the present invention contains the components (A), (B), (C) and (D) as essential components, but it is preferable that the curable composition further contain an inorganic fine powder as a component (E). When the curable composition contain an inorganic fine powder, the fluidity or thixotropic properties of the curable composition are improved, and also, the thermal conductivity of the resulting cured product is improved, so that heat dissipation properties can be imparted to the cured product. Examples of the inorganic fine powder include silicas such as fumed silica and precipitated silica; minerals such as quartz, mica, montmorillonite, silica stone, diatomaceous earth, sericite, kaolinite, flint, feldspar powder, vermiculite, attapulgite, talc, minnesotaite, and pyrophyllite; metal nitrides such as silicon nitride, boron nitride, and aluminum nitride; metal oxides such as calcium oxide, magnesium oxide, titanium oxide, aluminum oxide, zinc oxide, and beryllium oxide; metal sulfates such as calcium sulfate and barium sulfate; silicon carbide, calcium carbonate, magnesium carbonate, and zinc carbonate. The (E) inorganic fine powder may also be treated on the surfaces with a silane coupling agent, a titanium coupling agent, an aluminum coupling agent or the like, in order to enhance the compatibility with components (A), (B), (C) and (D). Among them, silicas are preferred from the viewpoint of having an excellent effect of improving thixotropic properties, and it is preferable to use silicas with an inorganic fine powder having high thermal conductivity, for example, aluminum oxide, silicon nitride, boron nitride or silicon carbide, in combination.

The average particle size of the (E) inorganic fine powder is preferably 0.05 to 500 µm, more preferably 0.1 to 200 µm, and most preferably 0.2 to 50 µm, in view of compatibility with the components (A), (B), (C) and (D). Furthermore, the content of the (E) inorganic fine powder is preferably 10 to 90% by mass, and more preferably 20 to 80% by mass, based on the curable composition for semiconductor encapsulation of the present invention, in view of heat resistance and handleability.

The curable composition for semiconductor encapsulation of the present invention may also contain a weather resistance imparting agent as an optional component. As the weather resistance imparting agent, those that are well known and generally used, such as a light stabilizer, an ultraviolet absorber, a phenolic antioxidant, a sulfur-based antioxidant, and a phosphorus-based antioxidant, can be used. Examples of the light stabilizer include hindered amines; and examples of the ultraviolet absorber include 2-hydroxybenzophenones, 2-(2-hydroxyphenyl)benzotriazoles, 2-(2-hydroxyphenyl)-4,6-diaryl-1,3,5-triazines, benzoates, and cyanoacrylates. Examples of the phenolic antioxidant include triethylene glycol bis[3-(3-t-butyl-5-methyl-4-hydroxyphenyl)propionate], dibutylhydroxytoluene (BHT), and 2,6-di-t-butyl-para-cresol (DBPC); examples of the sulfur-based antioxidant include dialkyl thiodipropionates, and β-alkylmercaptopropionic acid esters; and examples of the phosphorus-based antioxidant include organic phosphites.

In the case of using a weather-resistance imparting agent, the content is preferably 0.0001 to 50% by mass, and more preferably 0.001 to 10% by mass, based on the curable composition for semiconductor encapsulation of the present invention, in view of heat resistance, electrical properties, curability, mechanical properties, storage stability, and handleability.

The curable composition for semiconductor encapsulation of the present invention can also contain other various resins, additives, fillers and the like that are publicly known, to the extent that the intended performance of the present invention is not impaired. Examples of various resins that can be optionally incorporated include a polyimide resin, a polyether resin such as polyethylene glycol or polypropylene glycol, a polyurethane resin, an epoxy resin, a phenolic resin, a polyester resin, a melamine resin, a polyamide resin, and a polyphenylene sulfide resin. Examples of additives that can be optionally incorporated include an antistatic agent.

The curable composition for semiconductor encapsulation of the present invention is a composition formed by mixing, as essential components, a particular SiH group-containing siloxane compound as the component (A), a particular vinyl group-containing siloxane compound as the component (B), a compound having at least three SiH groups or at least three vinyl groups as the component (C), and a hydrosilylation catalyst as the component (D), and the composition can be cured by heating. The method of curing the composition may be any of a method of mixing those components immediately before use, and heating the mixture to cure; and a method of mixing all the components in advance, and heating the mixture at the time of use to cure.

The heating temperature in the case of curing the composition is preferably 100 to 250° C., more preferably 110 to 200° C., and most preferably 130 to 180° C. The curing time is preferably 0.1 to 10 hours, and more preferably 0.5 to 6 hours.

The curable composition for semiconductor encapsulation of the present invention has excellent flexibility and satisfactory electrical insulation properties at high temperatures, and can give a cured product which has less deterioration of the electrical insulation properties even when used at high temperatures. Therefore, the curable composition can be suitably used as an encapsulating agent for silicon carbide power semiconductors that are used as medium- to high-capacity power semiconductors, or for modules or devices combining these power semiconductors. Examples of such power semiconductor devices include a GTO (Gate Turn-Off) thyristor, an insulated bipolar transistor (IGBT), a metal oxide semiconductor field effect transistor (MOSFET), a static induction transistor (SIT), a diode, a power transistor, a thyristor, and a TRIAC. Furthermore, examples of such modules include a general-purpose inverter module, an IPM (intelligent power module), and an inverter module for automobiles.

The power semiconductor device, which is the semiconductor device of the present invention that has been encapsulated by curing the curable composition for semiconductor encapsulation of the present invention, is used in railway vehicles, heavy electric plants, hybrid cars, electric cars, robot welding machines, elevators, air-conditioners, UPS (uninterruptible power supply devices), general-purpose inverters (controllers for general-purpose motors), washing machines, electronic ranges, electromagnetic cookers, electric fans, refrigerators, electric rice cookers, VTRs, audio equipment, and the like.

EXAMPLES

Hereinafter, the present invention will be described in more detail by way of Examples, but the present invention is not intended to be limited to these Examples. Meanwhile, unless particularly stated otherwise, the units "parts" and "percent (%)" in the Examples are on a mass basis.

The raw materials used in the preparation of the curable compositions and cured products thereof of Examples 1 to 9 and Comparative Examples 1 to 6 are as follows.
<Component (A)>

Synthesis Example 1

Production of Compound A-1

In a glass reaction vessel equipped with a nitrogen gas inlet tube, a thermometer and a stirring apparatus, 106.7 g (0.135 mol) of octaphenyltetrasiloxane, 468.3 g (1.56 mol) of octamethyltetrasiloxane, and 10.4 g (0.15 mol) of potassium methoxide were introduced, and the mixture was allowed to react while stirred for 2 hours at 150° C. in a nitrogen atmosphere. After the reaction liquid was cooled, 575 g of toluene as a solvent, and 1150 g of a 22% aqueous hydrochloric acid solution were added thereto, and the resulting mixture was allowed to react while stirred for 22 hours at 90° C. Thereafter, the water content in the reaction liquid was reduced to 10 ppm or less by refluxing toluene, while removing water in an azeotropic manner. The reaction liquid was cooled to 25° C., and then 193 g of pyridine was added thereto. Subsequently, 153.2 g (1.62 mol) of dimethylchlorosilane as a halosilane compound was added dropwise to the reaction liquid under stirring, and the mixture was further allowed to react while stirred for 2 hours at 40° C. After completion of the reaction, the reaction liquid was washed seven times with 800 g of distilled water, and then the solvent was distilled off under reduced pressure. The residue was further subjected to thin film distillation two times, and was purified by filtration through a membrane filter. Thus, 444.2 g (yield 75%) of a compound A-1 was obtained, which was the component (A) according to the present invention. The mass average molecular weight of the compound A-1 was 10700, the number average molecular weight was 4050, and the SiH group content of the compound A-1 was 0.36 mmol/g. Furthermore, the proportion of the number of aryl groups each having 6 to 10 carbon atoms and bonded to silicon atoms, with respect to the sum of the number of alkyl groups each having 1 to 4 carbon atoms and bonded to silicon atoms and the number of aryl groups each having 6 to 10 carbon atoms and bonded to silicon atoms in one molecule, was 0.08, and the content of $Y^1$—$CH_2CH_2$ groups was 0 mmol/g.

Synthesis Example 2

Production of Compound A-2

The same procedure as in Synthesis Example 1 was carried out, except that the amount of octaphenyltetrasiloxane used was changed from 106.7 g (0.135 mol) to 159.5 g (0.201 mol), and the amount of octamethyltetrasiloxane used was changed from 468.3 g (1.56 mol) to 415.5 g (1.40 mol), and thus 432 g (yield 73%) of a compound A-2 was obtained, which was the component (A) according to the present invention. The mass average molecular weight of the compound A-2 was 10900, the number average molecular weight was 4150, and the SiH group content of the compound A-2 was 0.35 mmol/g. Furthermore, the proportion of the number of aryl groups each having 6 to 10 carbon atoms and bonded to silicon atoms, with respect to the sum of the number of alkyl groups each having 1 to 4 carbon atoms and bonded to silicon atoms and the number of aryl groups each having 6 to 10 carbon atoms and bonded to silicon atoms in one molecule, was 0.13, and the content of $Y^1$—$CH_2CH_2$ groups was 0 mmol/g.

Synthesis Example 3

Production of Compound A-3

The same procedure as in Synthesis Example 1 was carried out, except that the amount of octaphenyltetrasiloxane used was changed from 106.7 g (0.135 mol) to 344.7 g (0.435 mol), and the amount of octamethyltetrasiloxane used was changed from 468.3 g (1.56 mol) to 230.3 g (0.778 mol), and thus 426 g (yield 72%) of a compound A-3 was obtained, which was the component (A) according to the present invention. The mass average molecular weight of the compound A-3 was 10700, the number average molecular weight was 4050, and the SiH group content of the compound A-3 was 0.36 mmol/g. Furthermore, the proportion of the number of aryl groups each having 6 to 10 carbon atoms and bonded to silicon atoms, with respect to the sum of the number of alkyl groups each having 1 to 4 carbon atoms and bonded to silicon atoms and the number of aryl groups each having 6 to 10 carbon atoms and bonded to silicon atoms in one molecule, was 0.36, and the content of $Y^1$—$CH_2CH_2$ groups was 0 mmol/g.

Synthesis Example 4

Production of Compound A-4

In a glass reaction vessel equipped with a nitrogen gas inlet tube, a thermometer and a stirring apparatus, 150.0 g (52.5 mmol in terms of SiH groups) of the compound A-1, 2.51 g (27.0 mmol in terms of vinyl groups) of 1,1,3,3-tetramethyl-1,2-divinylsiloxane, 7.5 mg of a platinum-carbonylvinylmethyl complex as a catalyst, and 500 g of xylene as a solvent were introduced, and the mixture was allowed to react while stirred for one hour at 135° C. in a nitrogen atmosphere. The reaction liquid was concentrated under reduced pressure until the content of xylene decreased to half the original amount, and then the reaction liquid was washed four times with 270 g of acetonitrile. Subsequently, the solvent was distilled off under reduced pressure, and thus 149.5 g (yield 98%) of a compound A-4 was obtained, which was the component (A) according to the present invention. The mass average molecular weight of the compound A-4 was 34000, the number average molecular weight was 8610, and the SiH group content of the compound A-4 was 0.16 mmol/g. Furthermore, the proportion of the number of aryl groups each having 6 to 10 carbon atoms and bonded to silicon atoms, with respect to the sum of the number of alkyl groups each having 1 to 4 carbon atoms and bonded to silicon atoms and the number of aryl groups each having 6 to 10 carbon atoms and bonded to silicon atoms in one molecule, was 0.08, and the content of $Y^1$—$CH_2CH_2$ groups was 0.18 mmol/g.

<Component (B)>

Synthesis Example 5

Production of Compound B-1

In a glass reaction vessel equipped with a nitrogen gas inlet tube, a thermometer and a stirring apparatus, 187.9 g (0.236 mol) of octaphenylcyclotetrasiloxane, 1334.9 g (4.50 mol) of octamethylcyclotetrasiloxane, 37.3 g (0.20 mol) of 1,1,3,3-tetramethyl-1,3-divinyldisiloxane, 250 g of N-methylpyrrolidone as a reaction solvent, and 2.24 g (0.04 mol) of potassium hydroxide as a catalyst were introduced, and the mixture was allowed to react while stirred for 5 hours at 70° C. in a nitrogen atmosphere. The reaction liquid was cooled to 25° C., and 34.8 g (0.44 mol) of pyridine, and 1000 g of toluene as a solvent were added thereto. Subsequently, 36.2 g (0.3 mol) of dimethylvinylchlorosilane was added dropwise thereto. The mixture was heated to 70° C., and was allowed to react while stirred for one hour at 70° C. After completion of the reaction, the reaction liquid was washed seven times with 800 g of distilled water, and then the solvent was distilled off under reduced pressure. The residue was further subjected to thin film distillation two times, and was filtered through a membrane filter. Thus, 1190 g (yield 76%) of a compound B-1 was obtained, which was the component (B) according to the present invention. The mass average molecular weight of the compound B-1 was 12800, the number average molecular weight was 4850, and the vinyl group content of the compound B-1 was 0.30 mmol/g. Furthermore, the proportion of the number of aryl groups each having 6 to 10 carbon atoms and bonded to silicon atoms, with respect to the sum of the number of alkyl groups each having 1 to 4 carbon atoms and bonded to silicon atoms and the number of aryl groups each having 6 to 10 carbon atoms and bonded to silicon atoms in one molecule, was 0.05, and the sum of the contents of $Y^2$—$CH_2CH_2$ groups and vinyl groups was 0.30 mmol/g.

Synthesis Example 6

Production of Compound B-2

The same procedure as in Synthesis Example 5 was carried out, except that the amount of octaphenylcyclotetrasiloxane used was changed from 187.9 g (0.236 mol) to 348.8 g (0.439 mol), and the amount of octamethylcyclotetrasiloxane used was changed from 1334.9 g (4.50 mol) to 1174 g (3.96 mol), and thus 1189 g (yield 74%) of a compound B-2 was obtained, which was the component (B) according to the present invention. The mass average molecular weight of the compound B-2 was 12600, the number average molecular weight was 4750, and the vinyl group content of the compound B-2 was 0.31 mmol/g. Furthermore, the proportion of the number of aryl groups each having 6 to 10 carbon atoms and bonded to silicon atoms, with respect to the sum of the number of alkyl groups each having 1 to 4 carbon atoms and bonded to silicon atoms and the number of aryl groups each having 6 to 10 carbon atoms and bonded to silicon atoms in one molecule, was 0.10, and the sum of the contents of $Y^2$—$CH_2CH_2$ groups and vinyl groups was 0.31 mmol/g.

Synthesis Example 7

Production of Compound B-3

The same procedure as in Synthesis Example 5 was carried out, except that the amount of octaphenylcyclotetrasiloxane used was changed from 187.9 g (0.236 mol) to 609.2 g (0.768 mol), and the amount of octamethylcyclotetrasiloxane used was changed from 1334.9 g (4.50 mol) to 913.6 g (3.08 mol), and thus 1142 g (yield 73%) of a compound B-3 was obtained, which was the component (B) according to the present invention. The mass average molecular weight of the compound B-3 was 11900, the number average molecular weight was 4650, and the vinyl group content of the compound B-3 was 0.31 mmol/g. Furthermore, the proportion of the number of aryl groups each having 6 to 10 carbon atoms and bonded to silicon atoms, with respect to the sum of the number of alkyl groups each having 1 to 4 carbon atoms and bonded to silicon atoms and the number of aryl groups each having 6 to 10 carbon atoms and bonded to silicon atoms in one molecule, was 0.19, and the sum of the contents of $Y^2$—$CH_2CH_2$ groups and vinyl groups was 0.31 mmol/g.

<Component (C)>

Synthesis Example 8

Production of Compound C-1

In a glass reaction vessel equipped with a nitrogen gas inlet tube, a thermometer and a stirring apparatus, 150.0 g (45.1 mmol in terms of vinyl groups) of the compound B-1, 74.1 g (225 mmol) of tetrakis(dimethylsiloxy)silane, 7.5 mg of a platinum-carbonylvinylmethyl complex as a catalyst, and 500 g of xylene as a solvent were introduced, and the mixture was allowed to react while stirred for one hour at 135° C. in a nitrogen atmosphere. The reaction liquid was concentrated under reduced pressure until the content of xylene decreased to half the original amount, and then the residue was washed four times with 270 g of acetonitrile. Subsequently, the solvent was distilled off under reduced pressure, and thus 143.26 g (yield 89%) of a compound C-1 was obtained, which was the component (C) according to the present invention. The mass average molecular weight of the compound C-1 was 14000, the number average molecular weight was 7200, and the SiH group content of the compound C-1 was 0.75 mmol/g.

Synthesis Example 9

Production of Compound C-2

The same procedure as in Synthesis Example 8 was carried out, except that 150.0 g (46.1 mmol in terms of vinyl groups) of the compound B-2 was used in place of the compound B-1, and thus 143.26 g (yield 89%) of a compound C-2 was obtained, which was the component (C) according to the present invention. The mass average molecular weight of the compound C-2 was 13500, the number average molecular weight was 7000, and the SiH group content of the compound C-2 was 0.75 mmol/g.

Synthesis Example 10

Production of Compound C-3

The same procedure as in Synthesis Example 8 was carried out, except that 150.0 g (46.9 mmol in terms of vinyl groups) of the compound B-3 was used in place of the compound B-1, and thus 143.26 g (yield 89%) of a compound C-3 was obtained, which was the component (C) according to the present invention. The mass average molecular weight of the compound C-3 was 13300, the number average molecular weight was 6800, and the SiH group content of the compound C-3 was 0.76 mmol/g.

Synthesis Example 11

Production of Compound C-4

The same procedure as in Synthesis Example 8 was carried out, except that 54.1 g (225 mmol) of the 2,4,6,8-tetramethylcyclotetrasiloxane was used in place of 74.1 g (225 mmol) of tetrakis(dimethylsiloxy)silane, and thus 148.1 g (yield 90%) of a compound C-4 was obtained, which was the component (C) according to the present invention. The mass average molecular weight of the compound C-4 was 13300, the number average molecular weight was 6800, and the SiH group content of the compound C-4 was 0.76 mmol/g.

Synthesis Example 12

Production of Compound C-5

The same procedure as in Synthesis Example 8 was carried out, except that 150.0 g (46.1 mmol in terms of vinyl groups) of the compound B-2 was used in place of the compound B-1, and 54.1 g (225 mmol) of the 2,4,6,8-tetramethylcyclotetrasiloxane was used in place of 74.1 g (225 mmol) of tetrakis(dimethylsiloxy)silane, and thus 146.7 g (yield 89%) of a compound C-5 was obtained, which was the component (C) according to the present invention. The mass average molecular weight of the compound C-5 was 13500, the number average molecular weight was 7000, and the SiH group content of the compound C-5 was 0.75 mmol/g.

Synthesis Example 13

Production of Compound C-6

The same procedure as in Synthesis Example 8 was carried out, except that 150.0 g (46.9 mmol in terms of vinyl groups) of the compound B-3 was used in place of the compound B-1, and 54.1 g (225 mmol) of the 2,4,6,8-tetramethylcyclotetrasiloxane was used in place of 74.1 g (225 mmol) of tetrakis(dimethylsiloxy)silane, and thus 146.8 g (yield 89%) of a compound C-6 was obtained, which was the component (C) according to the present invention. The mass average molecular weight of the compound C-6 was 13300, the number average molecular weight was 6800, and the SiH group content of the compound C-6 was 0.76 mmol/g.
Compound C-7: Phenyltris(dimethylsiloxy)silane
<Component (D)>
Compound D-1: Platinum-carbonylvinylmethyl complex
<Comparative Compound>

Comparative Synthesis Example 1

Production of Compound A'-1

The same procedure as in Synthesis Example 1 was carried out, except that 575 g (1.94 mol) of octamethyltetrasiloxane was used in place of 106.7 g (0.135 mol) of octaphenyltetrasiloxane and 468.3 g (1.56 mol) of octamethyltetrasiloxane, and thus 443.0 g (yield 75%) of a comparative compound A'-1 was obtained. The mass average molecular weight of the compound A'-1 was 10200, the number average molecular weight was 4020, and the SiH group content of the compound A'-1 was 0.36 mmol/g.

Comparative Synthesis Example 2

Production of Compound B'-1

The same procedure as in Synthesis Example 5 was carried out, except that 1523 g (5.15 mol) of octamethyltetrasiloxane was used in place of 187.9 g (0.236 mol) of octaphenyltetrasiloxane and 1334.9 g (4.50 mol) of octamethylcyclotetrasiloxane, and thus 1237 g (yield 76%) of a comparative compound B'-1 was obtained. The mass average molecular weight of the compound B'-1 was 12500, the number average molecular weight was 4830, and the vinyl group content of the compound B'-1 was 0.30 mmol/g.

Comparative Synthesis Example 3

Production of Compound C'-1

The same procedure as in Synthesis Example 8 was carried out, except that the comparative compound B'-1 was used in place of the compound B-1, and thus 143.1 g (yield 89%) of a comparative compound C'-1 was obtained. The mass average molecular weight of the compound C'-1 was 14000, the number average molecular weight was 7200, and the SiH group content of the compound C-1 was 0.75 mmol/g.

Comparative Synthesis Example 4

Production of Compound B'-2

The same procedure as in Synthesis Example 5 was carried out, except that the amount of 1,1,3,3-tetramethyl-1,3-divinyldisiloxane used was changed from 37.3 g (0.20 mol) to 223.8 g (1.20 mol), and thus 1362 g (yield 75%) of a comparative compound B'-2 was obtained. The mass average molecular weight of the compound B'-2 was 2290, the number average molecular weight was 1040, and the vinyl group content of the compound B'-2 was 0.69 mmol/g.

Comparative Synthesis Example 5

Production of Compound B'-3

In a glass reaction vessel equipped with a nitrogen gas inlet tube, a thermometer and a stirring apparatus, 100 g (0.462 mol) of diphenylsilanediol was dissolved in 200 mL of toluene, and the solution was stirred. 80 g of pyridine and 122.6 g (1.016 mol) of chlorodimethylvinylsilane were added to the solution, and the mixture was kept at 60° C. and stirred for one hour. After completion of the reaction, the reaction liquid was washed five times with 200 mL of distilled water, and then the solvent was distilled off under reduced pressure. Thus, 168.8 g (yield 95%) of a comparative compound B'-3 was obtained. The number average molecular weight was 385, and the vinyl group content of the compound B'-3 was 2.6 mmol/g.

Comparative Synthesis Example 6

Production of Compound A'-2

The same procedure as in Comparative Synthesis Example 5 was carried out, except that 95.5 g (1.016 mol) of chlorodimethylsilane was used in place of 122.6 g (1.016 mol) of chlorodimethylvinylsilane, and thus 145.8 g (yield 95%) of a comparative compound A'-2 was obtained. The number average molecular weight was 333, and the SiH group content of the compound A'-2 was 3.0 mmol/g.

The compounds obtained in Synthesis Examples 1 to 13 and Comparative Synthesis Examples 1 to 6 were mixed in the compositions indicated in the following [Table 1], and thus curable composition of Examples 1 to 9 and Comparative Examples 1 to 6 were prepared. Meanwhile, the numbers in the parentheses ( ) in the table indicate mass ratios. Furthermore, the contents of the heat resistance affecting groups determined by calculation [the total amount of vinyl groups, $Y^1$—$CH_2CH_2$ groups, $Y^2$—$CH_2CH_2$ groups, and groups that are obtainable through a reaction between vinyl groups and SiH groups, relative to the total mass of the components (A) to (C)] are presented in [Table 1].

TABLE 1

| | Component (A) | Component (B) | Component (C) | Component (D) | Content of heat resistance affecting groups (mol/g) |
|---|---|---|---|---|---|
| Example 1 | A-1 (45) | B-1 (54) | C-1 (1) | D-1 (0.008) | 0.16 |
| Example 2 | A-2 (45) | B-2 (54) | C-2 (1) | D-1 (0.008) | 0.17 |
| Example 3 | A-3 (45) | B-3 (54) | C-3 (1) | D-1 (0.008) | 0.17 |
| Example 4 | A-4 (90) | B-2 (54) | C-2 (1) | D-1 (0.012) | 0.23 |
| Example 5 | A-1 (45) | B-1 (54) | C-4 (1) | D-1 (0.008) | 0.16 |
| Example 6 | A-2 (45) | B-2 (54) | C-5 (1) | D-1 (0.008) | 0.17 |
| Example 7 | A-3 (45) | B-3 (54) | C-6 (1) | D-1 (0.008) | 0.17 |
| Example 8 | A-4 (90) | B-2 (54) | C-5 (1) | D-1 (0.012) | 0.23 |
| Example 9 | A-2 (45) | B-2 (54) | C-4 (0.1) | D-1 (0.008) | 0.17 |
| Comparative Example 1 | A'-1 (45) | B'-1 (54) | C'-1 (1) | D-1 (0.008) | 0.16 |
| Comparative Example 2 | A-2 (45) | B'-2 (23) | C-2 (1) | D-1 (0.006) | 0.23 |
| Comparative Example 3 | A'-2 (45) | B'-3 (45) | C-1 (1) | D-1 (0.008) | 1.04 |
| Comparative Example 4 | A'-1 (45) | B'-1 (54) | C-4 (1) | D-1 (0.008) | 0.16 |
| Comparative Example 5 | A-2 (45) | B'-2 (23) | C-5 (1) | D-1 (0.006) | 0.23 |
| Comparative Example 6 | A'-2 (45) | B'-3 (45) | C-4 (1) | D-1 (0.008) | 1.04 |

For the curable compositions of Examples 1 to 9 and Comparative Examples 1 to 6, test specimens were produced, and the following evaluations were carried out by the test methods of 1 to 3 as described below. The results presented in [Table 2].

1. Heat Resistance Test

Each of the curable compositions of Examples 1 to 9 and Comparative Examples 1 to 6 was placed in a glass cylindrical vessel having an internal diameter of 25 mm, and was heated for 30 minutes in a constant temperature chamber at 150° C. Thereby, the curable composition was cured, and then was released from the frame. Thus, a cylindrically shaped cured product test specimen having a diameter of 25 mm and a height of 15 mm was prepared. This test specimen was stored in a constant temperature chamber at 250° C., and the time taken until the shore hardness measured according to JIS K6253 (method for determining the hardness of vulcanized rubber and thermoplastic rubber) exceeded A20, was measured. As this time is longer, it indicates higher heat resistance. Meanwhile, the shore hardness values of the test specimens before the test were all A5 to A10. The results are presented in [Table 2].

2. Electrical Insulation Properties Test.

A silicon sheet having a thickness of 1 mm and having a circular hole with an internal diameter of 50 mm was disposed on a glass plate, and each of the curable compositions of Examples 1 to 9 and Comparative Examples 1 to 6 was poured into the hole. Subsequently, a glass plate was disposed thereon. This assembly was placed in a constant temperature chamber and heated for 3 hours at 150° C. to cure the composition. Subsequently, the cured product was released from the frame, and thus a disc-shaped cured product test having a diameter of 50 mm and a thickness of 1 mm was produced. In order to investigate the electrical insulation properties at normal temperature to high temperatures, and the electrical insulation properties after thermal hysteresis, the intrinsic volume resistivities of the cured product test specimen at 25° C., 100° C. and 200° C. were measured. Subsequently, the cured product test specimen was stored in a constant temperature chamber at 250° C. for 50 hours and then cooled to 25° C., and the volume resistivities at 100° C. to 200° C. were measured. The results are presented in [Table 2].

The measurement of the intrinsic volume resistivity was carried out by using an insulation resistance measuring apparatus (manufactured by Ulvac-Rico, Inc., trade name: EHR-2000SP), after a voltage of 200 V was applied to the test specimen at 25° C., and subsequently, the test specimen was stored at the measurement temperature for 30 minutes.

3. Heat Cycle Test

Each of the curable compositions of Examples 1 to 9 and Comparative Examples 1 to 6 was introduced into a 15-ml type B porcelain crucible (JIS R1301 (porcelain crucible for chemical analysis)), such that the depth at the central part reached 10 mm. This crucible was placed in a constant temperature chamber and was heated for 3 hours at 150° C. to cure the composition. The porcelain crucible containing the cured product was covered with a lid, and the crucible was subjected to heat cycles in the range of from −50° C. to 200° C. using a temperature cycle testing machine (manufactured by Kusumoto Chemicals, Ltd., type: WINTEC NT530A). The crucible was taken out at every 100$^{th}$ cycle, and the cured product inside the crucible was observed to investigate the number of cycles at which cracks or detachment from the crucible occurred. The results are presented in [Table 2]

nent (C), a compound represented by the following formula (19) or by the following formula (20); and as component (D), a hydrosilylation catalyst:

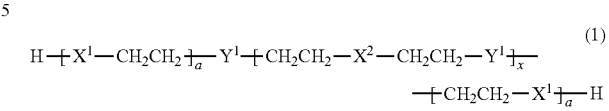
(1)

wherein $X^1$ represents a residue obtainable by excluding hydrogen atoms from the SiH groups of a compound having two SiH groups and having a molecular weight of 1000 or less; $X^2$ represents a residue obtainable by excluding hydrogen atoms from the SiH groups of a compound having two SiH groups and having a molecular weight of 1000 or less, or

TABLE 2

|  | Heat resistance test | Electrical insulation properties test | | | | | | Heat cycle test |
|---|---|---|---|---|---|---|---|---|
|  |  | Before heating at high temperature (Ω · cm) | | | After 250° C. × 50 hours (Ω · cm) | | |  |
|  |  | 25° C. | 100° C. | 200° C. | 25° C. | 100° C. | 200° C. |  |
| Example 1 | 400 | $2.0 \times 10^{14}$ | $7.0 \times 10^{13}$ | $1.0 \times 10^{13}$ | $1.4 \times 10^{14}$ | $5.0 \times 10^{13}$ | $7.8 \times 10^{12}$ | >1000 |
| Example 2 | 200 | $5.0 \times 10^{14}$ | $5.0 \times 10^{13}$ | $2.0 \times 10^{13}$ | $1.3 \times 10^{13}$ | $3.6 \times 10^{13}$ | $1.5 \times 10^{13}$ | >1000 |
| Example 3 | 400 | $2.0 \times 10^{14}$ | $7.0 \times 10^{13}$ | $1.0 \times 10^{13}$ | $1.5 \times 10^{14}$ | $6.1 \times 10^{13}$ | $8.5 \times 10^{12}$ | >1000 |
| Example 4 | 600 | $9.0 \times 10^{13}$ | $3.0 \times 10^{13}$ | $1.0 \times 10^{13}$ | $6.2 \times 10^{13}$ | $2.0 \times 10^{13}$ | $7.5 \times 10^{12}$ | >1000 |
| Example 5 | 400 | $2.2 \times 10^{14}$ | $7.5 \times 10^{13}$ | $1.2 \times 10^{13}$ | $1.5 \times 10^{14}$ | $5.2 \times 10^{13}$ | $7.9 \times 10^{12}$ | >1000 |
| Example 6 | 300 | $4.8 \times 10^{14}$ | $4.6 \times 10^{13}$ | $1.8 \times 10^{13}$ | $1.3 \times 10^{14}$ | $3.7 \times 10^{13}$ | $1.6 \times 10^{13}$ | >1000 |
| Example 7 | 500 | $2.1 \times 10^{14}$ | $7.5 \times 10^{13}$ | $1.3 \times 10^{13}$ | $1.6 \times 10^{14}$ | $6.3 \times 10^{13}$ | $8.4 \times 10^{12}$ | >1000 |
| Example 8 | 600 | $9.0 \times 10^{13}$ | $3.1 \times 10^{13}$ | $1.1 \times 10^{13}$ | $6.3 \times 10^{13}$ | $2.1 \times 10^{13}$ | $7.7 \times 10^{12}$ | >1000 |
| Example 9 | 400 | $1.9 \times 10^{14}$ | $6.5 \times 10^{13}$ | $3.0 \times 10^{13}$ | $1.3 \times 10^{14}$ | $2.7 \times 10^{13}$ | $8.0 \times 10^{12}$ | >1000 |
| Comparative Example 1 | 20 | $1.0 \times 10^{13}$ | $9.0 \times 10^{12}$ | $5.0 \times 10^{12}$ | $2.6 \times 10^{11}$ | $9.0 \times 10^{10}$ | $1.1 \times 10^{10}$ | 100 |
| Comparative Example 2 | 10 | $9.0 \times 10^{13}$ | $1.5 \times 10^{12}$ | $3.0 \times 10^{10}$ | $1.3 \times 10^{11}$ | $8.6 \times 10^{10}$ | $4.0 \times 10^{9}$ | 200 |
| Comparative Example 3 | 50 | $5.0 \times 10^{14}$ | $5.0 \times 10^{13}$ | $2.0 \times 10^{13}$ | N.D*1 | N.D*1 | N.D*1 | 300 |
| Comparative Example 4 | 30 | $1.1 \times 10^{13}$ | $9.1 \times 10^{12}$ | $4.8 \times 10^{12}$ | $2.5 \times 10^{11}$ | $8.8 \times 10^{10}$ | $1.1 \times 10^{10}$ | 100 |
| Comparative Example 5 | 20 | $9.0 \times 10^{13}$ | $1.6 \times 10^{12}$ | $2.9 \times 10^{10}$ | $1.4 \times 10^{12}$ | $8.5 \times 10^{10}$ | $3.9 \times 10^{9}$ | 200 |
| Comparative Example 6 | 40 | $4.9 \times 10^{14}$ | $4.8 \times 10^{13}$ | $2.0 \times 10^{13}$ | N.D*1 | N.D*1 | N.D*1 | 300 |

From the results of [Table 2], the cured product obtainable from the curable composition of the present invention has excellent heat resistance, and has excellent electrical insulation properties not only in the normal temperature range but also in the high temperature region. Furthermore, it can be seen that flexibility or adhesiveness can be maintained even under a thermal shock between −50° C. and 200° C. Therefore, the results of [Table 2] can be said to exhibit that the cured product obtainable from the curable composition of the present invention can be suitably used as an encapsulating material/insulating material, particularly an encapsulating material/insulating material for power semiconductors used in railway vehicles, hybrid cars, electric cars and the like, which are used between low temperature and high temperature; among others, as an encapsulating material/insulating material for SiC power semiconductors.

The invention claimed is:

1. A curable composition for semiconductor encapsulation, comprising, as component (A), a SiH group-containing siloxane compound represented by the following formula (1); as component (B), a vinyl group-containing siloxane compound represented by the following formula (2); as compoa residue obtainable by excluding vinyl groups from a compound having two vinyl groups and having a molecular weight of 1000 or less; $Y^1$ represents a polysiloxane group represented by the following formula (3); a represents a number of 0 or 1; and x represents a number from 0 to 10, provided that the compound represented by the formula (1) is such that the mass average molecular weight is 3000 to 1,000,000; the proportion of the number of aryl groups each having 6 to 10 carbon atoms and bonded to silicon atoms, with respect to the sum of the number of alkyl groups each having 1 to 4 carbon atoms and bonded to silicon atoms and the number of aryl groups each having 6 to 10 carbon atoms and bonded to silicon atoms, is 0.05 to 0.5; and the content of $Y^1$—$CH^2CH^2$ groups is 0.2 mmol/g or less;

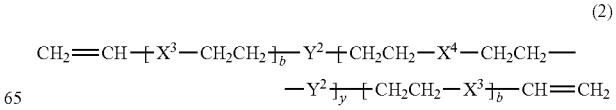
(2)

wherein $X^3$ represents a residue obtainable by excluding vinyl groups from a compound having two vinyl groups and having a molecular weight of 1000 or less; $X^4$ represents a residue obtainable by excluding vinyl groups from a compound having two vinyl groups and having a molecular weight of 1000 or less, or a residue obtainable by excluding hydrogen atoms from the SiH groups of a compound having two SiH groups and having a molecular weight of 1000 or less; $Y^2$ represents a polysiloxane group represented by the following formula (4); b represents a number of 0 or 1; and y represents a number from 0 to 10, provided that the compound represented by the formula (2) is such that the mass average molecular weight is 3000 to 1,000,000; the proportion of the number of aryl groups each having 6 to 10 carbon atoms and bonded to silicon atoms, with respect to the sum of the number of alkyl groups each having 1 to 4 carbon atoms and bonded to silicon atoms and the number of aryl groups each having 6 to 10 carbon atoms and bonded to silicon atoms, is 0.05 to 0.5; and the sum of the contents of $Y^2$—$CH^2CH^2$ groups and vinyl groups is 0.002 to 0.7 mmol/g;

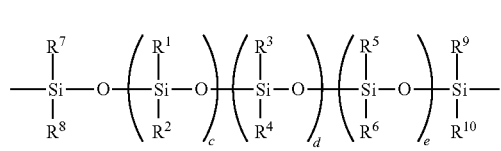

(3)

wherein $R^1$ to $R^3$ each independently represent an alkyl group having 1 to 4 carbon atoms; $R^4$ to $R^6$ each independently represent an aryl group having 6 to 10 carbon atoms; $R^7$ to $R^{10}$ each independently represent an alkyl group having 1 to 4 carbon atoms, or an aryl group having 6 to 10 carbon atoms; c, d and e represent numbers that make up the mass average molecular weight of the compound represented by the formula (1) to 3000 to 1,000,000;

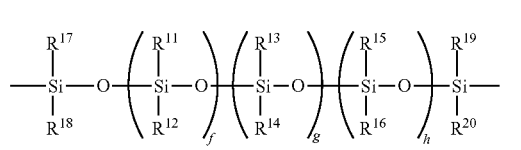

(4)

wherein $R^{11}$ to $R^{13}$ each independently represent an alkyl group having 1 to 4 carbon atoms; $R^{14}$ to $R^{16}$ each independently represent an aryl group having 6 to 10 carbon atoms; $R^{17}$ to $R^{20}$ each independently represent an alkyl group having 1 to 4 carbon atoms or an aryl group having 6 to 10 carbon atoms; f, g and h represent numbers that make up the mass average molecular weight of the compound represented by the formula (2) to 3000 to 1,000,000;

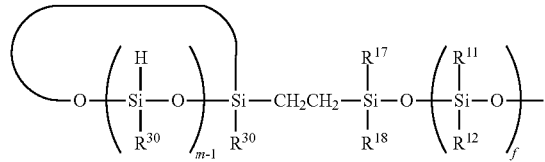

(19)

-continued

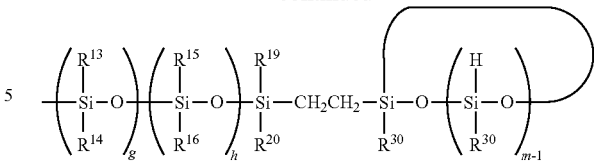

wherein $R^{30}$ represents an alkyl group having 1 to 4 carbon atoms, or an aryl group having 6 to 10 carbon atoms; m represents a number from 3 to 6; and $R^{11}$ to $R^{20}$, f, g and h have the same meanings as those defined for the formula (4); and

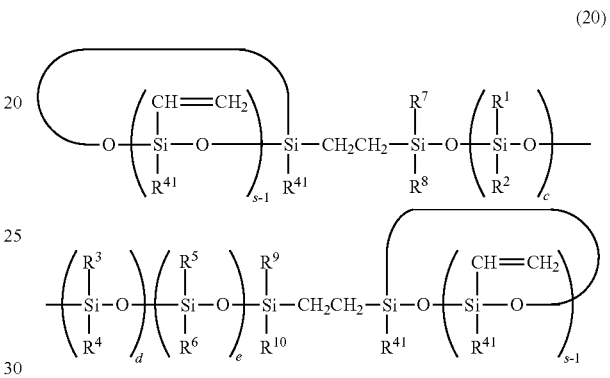

(20)

wherein $R^{41}$ represents an alkyl group having 1 to 4 carbon atoms or an aryl group having 6 to 10 carbon atoms; s represents a number from 3 to 6; and $R^1$ to $R^{10}$, c, d and e have the same meanings as those defined for the formula (3).

2. The curable composition for semiconductor encapsulation according to claim 1, wherein the polysiloxane group represented by the formula (3) and the polysiloxane group represented by the formula (4) are derived from compounds that are obtained by a method of linking a cyclic siloxane compound to a starting material by ring-opening polymerization, and introducing SiH groups or vinyl groups to the ends.

3. The curable composition for semiconductor encapsulation according to claim 1, wherein the proportion of vinyl groups with respect to SiH groups in the composition is 0.5 to 2 as a molar ratio.

4. The curable composition for semiconductor encapsulation according to claim 1, wherein the sum of the contents of vinyl groups, $Y^1$—$CH_2CH_2$ groups, and $Y^2$—$CH_2CH_2$ groups, relative to the total mass of the components (A), (B) and (C), is 0.005 to 0.5 mol/g.

5. The curable composition for semiconductor encapsulation according to claim 1, wherein the content of the component (C) is 0.01 to 10% by mass of the total amount of the components (A) and (B).

6. A semiconductor device encapsulated by curing the curable composition for semiconductor encapsulation according to claim 1.

7. The curable composition for semiconductor encapsulation according to claim 2, wherein the proportion of vinyl groups with respect to SiH groups in the composition is 0.5 to 2 as a molar ratio.

8. The curable composition for semiconductor encapsulation according to claim 2, wherein the sum of the contents of vinyl groups, $Y^1$—$CH_2CH_2$ groups, and $Y^2$—$CH_2CH_2$ groups, relative to the total mass of the components (A), (B) and (C), is 0.005 to 0.5 mol/g.

9. The curable composition for semiconductor encapsulation according to claim 3, wherein the sum of the contents of vinyl groups, $Y^1$—$CH_2CH_2$ groups, and $Y^2$—$CH_2CH_2$ groups, relative to the total mass of the components (A), (B) and (C), is 0.005 to 0.5 mol/g.

10. The curable composition for semiconductor encapsulation according to claim 2, wherein the content of the component (C) is 0.01 to 10% by mass of the total amount of the components (A) and (B).

11. The curable composition for semiconductor encapsulation according to claim 3, wherein the content of the component (C) is 0.01 to 10% by mass of the total amount of the components (A) and (B).

12. The curable composition for semiconductor encapsulation according to claim 4, wherein the content of the component (C) is 0.01 to 10% by mass of the total amount of the components (A) and (B).

13. A semiconductor device encapsulated by applying the curable composition of claim 2 to one or more components of the semiconductor device and then curing.

14. A semiconductor device encapsulated by applying the curable composition of claim 2 to one or more components of the semiconductor device and then curing.

* * * * *